(12) United States Patent
Kim

(10) Patent No.: US 11,864,455 B2
(45) Date of Patent: Jan. 2, 2024

(54) DISPLAY MODULE, DISPLAY DEVICE, AND METHOD OF MANUFACTURING THE DISPLAY MODULE

(71) Applicant: Samsung Display Co., Ltd., Yongin-Si (KR)

(72) Inventor: Woongsik Kim, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 41 days.

(21) Appl. No.: 17/220,236

(22) Filed: Apr. 1, 2021

(65) Prior Publication Data

US 2021/0226140 A1 Jul. 22, 2021

Related U.S. Application Data

(62) Division of application No. 16/393,074, filed on Apr. 24, 2019, now Pat. No. 10,998,511.

(30) Foreign Application Priority Data

Jun. 27, 2018 (KR) .................. 10-2018-0073864

(51) Int. Cl.
H10K 77/10 (2023.01)
H01L 27/12 (2006.01)
H10K 59/131 (2023.01)

(52) U.S. Cl.
CPC .......... H10K 77/111 (2023.02); H01L 27/124 (2013.01); H01L 27/1259 (2013.01); H10K 59/131 (2023.02)

(58) Field of Classification Search
CPC .............. H01L 27/124; H01L 51/0097; H01L 27/1259; H01L 27/3276; H10K 77/111; H10K 59/131
See application file for complete search history.

(56) References Cited

U.S. PATENT DOCUMENTS

| 5,737,272 A | 4/1998 | Uchiyama et al. |
| 9,293,485 B2 | 3/2016 | Youn et al. |
| 9,504,124 B2 | 11/2016 | Kim et al. |

(Continued)

FOREIGN PATENT DOCUMENTS

| CN | 107039377 A | 8/2017 |
| KR | 100370698 B1 | 3/2003 |

(Continued)

OTHER PUBLICATIONS

Extended European Search Report for Application No. 19182141.2-1211 dated Jan. 27, 2020.

*Primary Examiner* — Samuel A Gebremariam
(74) *Attorney, Agent, or Firm* — CANTOR COLBURN LLP

(57) ABSTRACT

A method of manufacturing a display module includes: providing a carrier substrate; providing a base layer, where a display area and a pad area are defined, on the carrier substrate; providing a circuit layer on the display area of the base layer and the pad area of the base layer; forming a though hole in the circuit layer and the base layer on the pad area; forming a conductive part by providing a conductive material from an upper surface of the circuit layer to the though hole formed in the pad area; and providing a circuit member electrically connected to the circuit layer below the base layer.

7 Claims, 32 Drawing Sheets

(56) References Cited

U.S. PATENT DOCUMENTS

| | | | |
|---|---|---|---|
| 9,882,152 | B2 | 1/2018 | Namkung et al. |
| 10,182,474 | B2 | 1/2019 | Kim et al. |
| 2014/0184057 | A1 | 7/2014 | Kim et al. |
| 2016/0336532 | A1 | 11/2016 | Li |
| 2018/0053905 | A1 | 2/2018 | Lee et al. |
| 2018/0090515 | A1 | 3/2018 | Sasaki et al. |
| 2018/0090702 | A1 | 3/2018 | Um et al. |
| 2018/0092166 | A1 | 3/2018 | Kim et al. |
| 2019/0189729 | A1* | 6/2019 | Zhang .................. H10K 59/179 |

FOREIGN PATENT DOCUMENTS

| | | |
|---|---|---|
| KR | 1020140140150 A | 12/2014 |
| KR | 1020150043647 A | 4/2015 |
| KR | 1020150102072 A | 9/2015 |
| KR | 1020170093835 A | 8/2017 |
| KR | 1020170133573 A | 12/2017 |
| KR | 1020180035982 A | 4/2018 |
| KR | 1020180036853 A | 4/2018 |

\* cited by examiner

DISPLAY MODULE, DISPLAY DEVICE, AND METHOD OF MANUFACTURING THE DISPLAY MODULE

This application is a divisional of U.S. patent application Ser. No. 16/393,074, filed on Apr. 24, 2019, which claims priority to Korean Patent Application No. 10-2018-0073864, filed on Jun. 27, 2018, and all the benefits accruing therefrom under 35 U.S.C. § 119, the content of which in its entirety is herein incorporated by reference.

BACKGROUND

1. Field

The disclosure herein relates to a display module with a reduced width of a non-display area, a display device including the display module, and a method of manufacturing the display module.

2. Description of the Related Art

In a module assembly equipment, which is a post-process equipment of a display panel, a process of electrically connecting the display panel and a drive chip may be performed. Such a coupling process may be classified into a process of a chip-on-glass ("COG") mounting method and a process of a tape-automated-bonding ("TAB") mounting method according to the driving chip mounting method.

The COG mounting method is a method through which a driving chip is directly mounted on a gate region and a data region of a display panel to transmit an electrical signal to the display panel. For example, the COG mounting method may bond a driving chip to a display panel using an anisotropic conductive film ("ACF").

The TAB mounting method is a method of bonding a tape carrier package or a flexible film on which a driving chip is mounted to a display panel. This method also uses the ACF to bond the display panel to one end of the tape carrier package or flexible film and to bond the printed circuit board to the other end of the tape carrier package or flexible film.

SUMMARY

The disclosure relates to a display module and a display device with reduced width of a non-display area, and to a display module manufacturing method for manufacturing the display module and the display device.

An embodiment of the invention provides a method of manufacturing a display module, the method including: providing a carrier substrate; providing a base layer, where a display area and a pad area are defined, on the carrier substrate; providing a circuit layer on the display area of the base layer and the pad area of the base layer; forming a though hole in the circuit layer and the base layer on the pad area; providing a conductive material from an upper surface of the circuit layer to the though hole formed in the pad area to form a conductive part; and providing a circuit member electrically connected to the circuit layer below the base layer.

In an embodiment, the pad area of the base layer may define a first pad area, a bending area and a second pad area, where the forming the though hole may include: forming a first contact hole in the circuit layer on the first pad area and in the first pad area of the base layer, and forming a second contact hole in the circuit layer on the second pad area and in the second pad area of the base layer.

In an embodiment, the method may further include: removing a portion of the bending area; and bending the bending area in a way such that the first contact hole and the second contact hole overlap each other when viewed from a plan view in a thickness direction of the display module, where the forming the conductive part may include providing the conductive material to the first contact hole and the second contact hole.

In an embodiment, the method may further include: providing a first mask layer on the upper surface of the circuit layer; forming a first mask pattern by patterning the first mask layer; forming the first contact hole and the second contact hole using the first mask pattern; removing the portion of the bending area using the first mask pattern; providing a second mask layer on the upper surface of the circuit layer; forming a second mask pattern by patterning the second mask layer; and patterning the circuit layer using the second mask pattern.

In an embodiment, the method may further include: providing a mask layer on the upper surface of the circuit layer; forming a first mask pattern by patterning the mask layer; forming the first contact hole and the second contact hole using the first mask pattern; forming a second mask pattern by ashing a portion of the first mask pattern; and patterning the circuit layer using the second mask pattern.

In an embodiment, the method may further include, after the bending of the bending area, grinding a portion of the bending area.

In an embodiment, the removing the portion of the bending area may include removing the portion of the bending area in a way such that a first thickness in the bending area of the base layer is less than a second thickness in the first pad area of the base layer.

In an embodiment, the removing the portion of the bending area may include removing the portion of the bending area in a way such that the first pad area and the second pad area are connected to each other by a remaining portion of the bending area.

In an embodiment, the method may further include: half-cutting an upper surface of the base layer or a lower surface of the bending area of the base layer; and bending the bending area in a way such that the first contact hole and the second contact hole may overlap each other when viewed from a plan view in a thickness direction of the display module, where the forming the conductive part may include providing the conductive material to the first contact hole and the second contact hole.

In an embodiment, the base layer may include a first alignment pattern disposed in the first pad area and a second alignment pattern disposed in the second pad area, and the method may further include bending the bending area in a way such that the second alignment pattern is aligned with the first alignment pattern.

In an embodiment, the base layer may include a first alignment pattern, and the circuit member includes a second alignment pattern, and the method may further include disposing the circuit member on a back surface of the base layer in a way such that the second alignment pattern is aligned with the first alignment pattern.

In an embodiment, the base layer may be provided in plurality, and the forming the base layer may include: providing a preliminary base layer, portions of which define base layers, respectively, on the carrier substrate; and forming a connection portion connecting the base layers to each other by removing a portion of the preliminary base layer, where the forming the connection portion and the forming the though hole may be performed at the same time.

In an embodiment, the method may further include separating the base layers from each other by cutting the connection portion.

In an embodiment of the invention, a display module includes: a base layer where a first hole is defined; a wiring layer disposed on the base layer, where a second hole is defined in the wiring layer on an area corresponding to the first hole when viewed from a plan view in a thickness direction of the display module; an image display element layer electrically connected to the wiring layer; a circuit member disposed below the base layer; and a conductive part disposed in the first hole and the second hole from an upper part of the wiring layer and electrically connecting the wiring layer and the circuit member.

In an embodiment, the display module may further include: a sub-base layer disposed below the base layer, where a third hole defined in the sub-base layer on an area corresponding to the second hole when viewed from the plan view in the thickness direction of the display module; and a sub-wiring layer disposed below the sub-base layer, where a fourth hole defined in the sub-wiring layer on an area corresponding to the third hole when viewed from the plan view in the thickness direction of the display module. In such an embodiment, the sub-wiring layer may be electrically connected to the circuit member, and the conductive part may be disposed in the first hole, the second hole, the third hole, and the fourth hole to electrically connect the wiring layer to the circuit member.

In an embodiment, the sub-base layer and the circuit member may be disposed on a back surface of the base layer, and the display module may further include a connection conductive part connecting the sub-base layer and the circuit member.

In an embodiment, the base layer may include a first alignment pattern, and the sub-base layer may include a second alignment pattern, wherein the first alignment pattern may be aligned with the second alignment pattern when viewed from the plan view in the thickness direction of the display module.

In an embodiment, the base layer may include a first alignment pattern, and the circuit member may include a second alignment pattern, wherein the first alignment pattern may be aligned with the second alignment pattern when viewed from the plan view in the thickness direction of the display module.

In an embodiment, when viewed from the plan view in the thickness direction of the display module, the base layer may include: first sides extending in a first direction and spaced apart from each other; second sides extending in a second direction intersecting the first direction and spaced apart from each other; and a connection side connecting one of the first sides to one of the second sides.

In an embodiment of the invention, a display device includes at least one display module, where the display module includes: a base layer where a first hole is defined; a wiring layer disposed on the base layer, where a second hole is defined in the wiring layer on an area corresponding to the first hole when viewed from a plan view in a thickness direction of the display module; a sub-base layer disposed below the base layer, where a third hole is defined in the sub-base layer on an area corresponding to the second hole when viewed from the plan view in the thickness direction of the display module; a sub-wiring layer disposed below the sub-base layer, where a fourth hole is defined in the sub-wiring layer on an area corresponding to the third hole when viewed from the plan view in the thickness direction of the display module; a circuit member disposed below the base layer; and a conductive part disposed in the first hole and the second hole to electrically connect the wiring layer and the circuit member.

BRIEF DESCRIPTION OF THE FIGURES

The above and other features of embodiments of the disclosure will become readily apparent by reference to the following detailed description when considered in conjunction with the accompanying drawings, in which.

DETAILED DESCRIPTION

Figure 1:
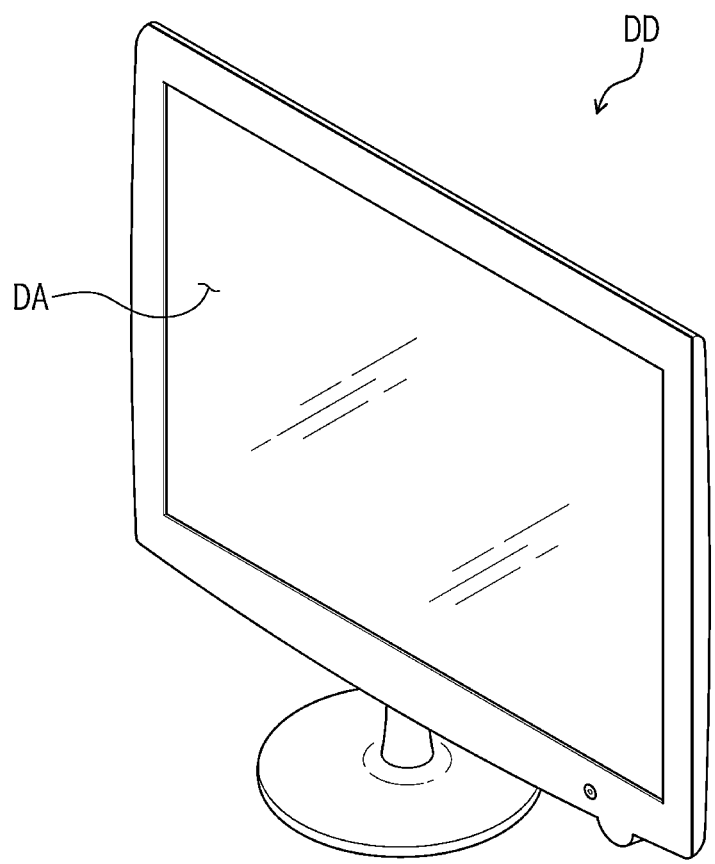
FIG. 1 is a perspective view of a display device according to an embodiment of the invention.
Figure 1:
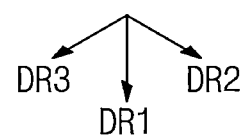

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when it is mentioned that a component (or, an area, a layer, a part, etc.) is referred to as being "on", "connected to" or "combined to" another component, it can be directly on, connected to, or combined to the other component or a third component may be present therebetween.

Additionally, in the drawings, the thicknesses, proportions, and dimensions of components are exaggerated for effective description. "Or" means "and/or." "At least one of A and B" means "A and/or B." "And/or" includes all of one or more combinations defined by related components.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein. As used herein, the singular forms, "a", "an" and "the" are intended to include the plural forms, including "at least one," unless the context clearly indicates otherwise.

In addition, terms such as "below", "the lower side", "on", and "the upper side" are used to describe a relationship of configurations shown in the drawing. The terms are described as a relative concept based on a direction shown in the drawing.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be explained described in detail with reference to the accompanying drawings.

FIG. 1 is a perspective view of a display device according to an embodiment of the invention.

Referring to FIG. 1, an embodiment of a display device DD may display an image through a display area DA. In FIG. 1, an embodiment where the display area DA has a surface defined by a first direction DR1 and a second direction DR2 intersecting the first direction DR1 is shown, but embodiments of the invention are not limited thereto. In an alternative embodiment of the invention, the display area of the display device may have a curved shape.

The thickness direction of the display device DD is indicated by the third direction DR3. The directions that the first to third directions DR1, DR2, and DR3 indicate may be converted to other directions as a relative concept. In this specification, the term "on a plane" means when viewed from a plan view in the third direction DR3.

In an embodiment, as shown in FIG. 1, the display device DD may be a television. Alternatively, the display device DD may be used in medium-sized electronic devices such as personal computers, notebook computers, personal digital terminals, car navigation units, game machines, smart phones, tablets, and cameras in addition to large-sized electronic devices such as monitors, or external billboards, for example, but not being limited thereto. The display device DD may be employed in other electronic devices without departing from the scope of the invention.

Figure 2A:
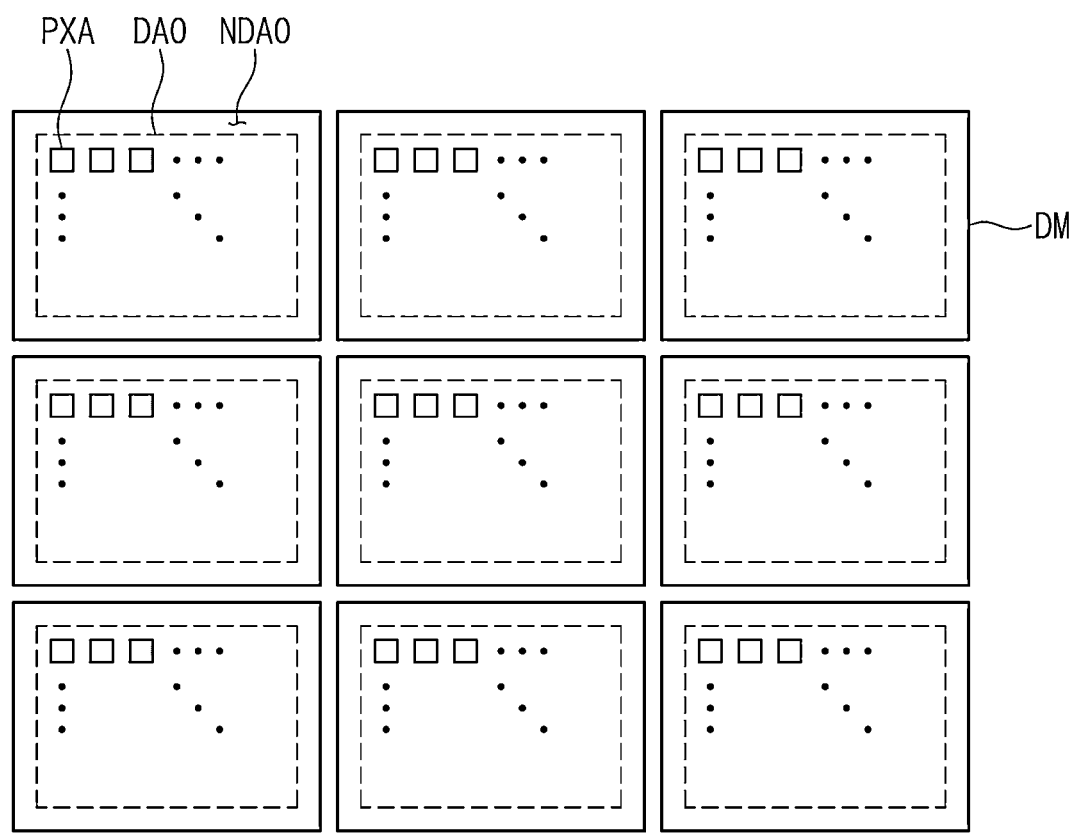
FIG. 2A is a plan view showing display modules constituting a display device according to an embodiment of the invention.
Figure 2A:
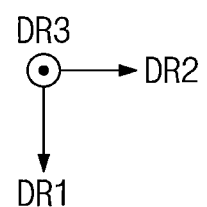

FIG. 2A is a plan view showing display modules constituting a display device according to an embodiment of the invention.

Referring to FIGS. 1 and 2A, to enlarge the size of the display device DD, the display device DD may include a plurality of display modules DM. The display modules DM may be arranged along the first direction DR1 and the second direction DR2, respectively. In an embodiment, as shown in FIG. 2A, three display modules DM are arranged in the first direction DR1 and three display modules DM are arranged in the second direction DR2. In such an embodiment, a total of nine display modules DM are arranged, but not being limited thereto. In such an embodiment, the number of the display modules DM included in the display device DD may be variously modified depending on the size of the display device DD or the size of the display modules DM. In an embodiment, as shown in FIG. 2A, each of the display modules DM may have a rectangular shape on a plane, but not being limited thereto. Alternatively, the shape of each of the display modules DM may be variously modified.

Each of the display modules DM may include a display area DA0 and a non-display area NDA0. In one embodiment, for example, the display area DA0 may be an area where a pixel light emission area PXA is defined and an image is displayed, and the non-display area NDA0 may surround the display area DA0 and may not display an image.

In such an embodiment where the display device DD includes the display modules DM, the display area DA of the display device DD (shown in FIG. 1) may overlap both the display area DA0 and the non-display area NDA0 of the display modules DM. Therefore, if the width of the non-display area NDA0 is greater than a predetermined width, the non-display area NDA0 may be viewed or recognized by a viewer. When the width of the non-display area NDA0 is reduced, the probability that the boundary between the display modules DM is visible may be reduced. Accordingly, in such an embodiment, as the width of the non-display area NDA0 is reduced, the display quality of the display device DD may be improved.

Figure 2B:
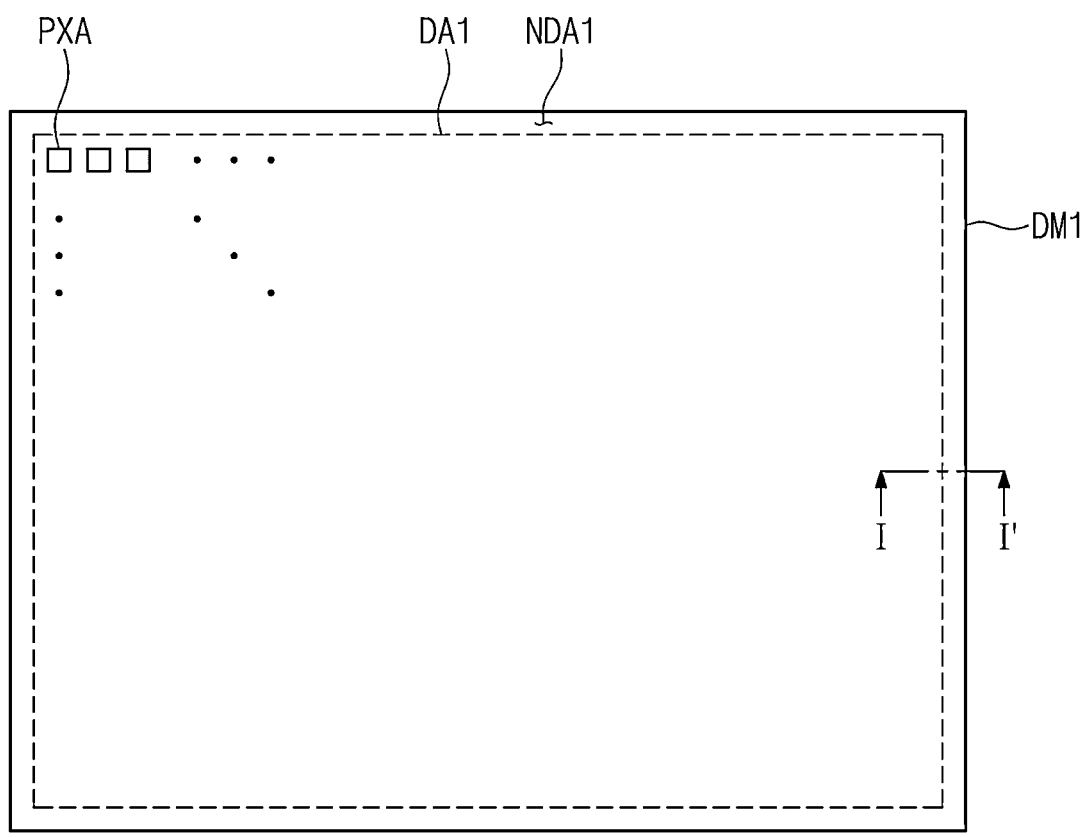
FIG. 2B is a plan view showing a display module constituting a display device according to an embodiment of the invention.
Figure 2B:
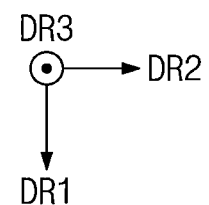

FIG. 2B is a plan view showing a display module constituting a display device according to an embodiment of the invention.

Referring to FIGS. 1 and 2B, an embodiment of the display device DD may include one display module DM1.

The display module DM1 may include a display area DA1 and a non-display area NDA1. The display area DA1 of the display module DM1 may correspond to the display area DA of the display device DD. However, this is merely exemplary, and the display area DA1 may have a larger area than the display area DA. As the width of the non-display area NDA1 in a substrate of the display module DM1 is reduced, the area ratio of the display area DA1 of the display module DM1 to the total area of the display module DM1 may be increased. Therefore, the size of a display screen may be increased by increasing the area ratio of the display area without increasing the size of a substrate.

Figure 3:
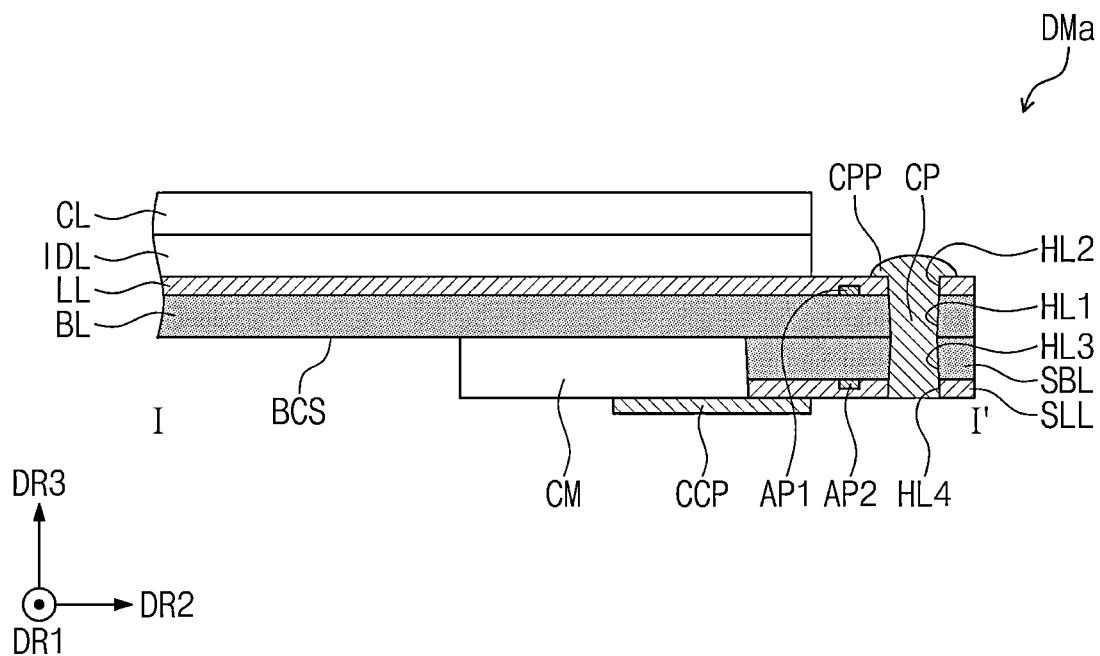
FIG. 3 is a cross-sectional view taken along line I-I' shown in FIG. 2B showing an embodiment of the display module.

FIG. 3 is a cross-sectional view taken along line I-I' shown in FIG. 2B showing an embodiment of the display module.

The display module DMa of FIG. 3 is an embodiment of the display module DM1 of FIG. 2B or the display modules DM of FIG. 2A. Each of the display modules DM in FIG. 2A may have a different size from the display module DM1 of FIG. 2B but may have substantially the same structure as the display module DM1 of FIG. 2B The display module DMa includes a base layer BL, a sub-base layer SBL, a wiring layer LL, a sub-wiring layer SLL, an image display element layer IDL, a circuit member CM, a cover layer CL, and a conductive part CP.

Each of the base layer BL and the sub-base layer SBL may include a flexible material, and may be, for example, a plastic substrate. The plastic substrate may include at least one selected from acrylic resin, methacrylic resin, polyisoprene, vinyl resin, epoxy resin, urethane resin, cellulose resin, siloxane-based resin, polyimide-based resin, polyamide-based resin, and perylene resin. In one embodiment, for example, the base layer BL and the sub-base layer SBL may include a single-layer polyimide-based resin. However, the invention is not limited thereto, and alternatively, the base layer BL may have a multi-layer structure (e.g., laminated structure) including a plurality of insulating layers.

A first hole HL1 may be defined in the base layer BL. The first hole HL1 may be a hole extending from an upper surface of the base layer BL toward a lower surface of the base layer BL.

A wiring layer LL may be disposed on the upper surface of the base layer BL. The wiring layer LL may define a conductive layer constituting a circuit layer. A second hole HL2 may be defined in one region of the wiring layer LL. In one embodiment, for example, the one region may be a region overlapping the first hole HL1 on a plane or when viewed from a thickness direction (i.e., the third direction DR3) of the display panel DMa or the base layer BL. The second hole HL2 may be a hole extending from the upper surface of the wiring layer LL toward the lower surface of the wiring layer LL.

The sub-base layer SBL may be disposed under the base layer BL. The sub-base layer SBL may have a same layer structure and include a same material as the base layer BL. The sub-base layer SBL may be a layer cut from the base layer BL. In FIG. 3, the base layer BL and the sub-base layer SBL are hatched in a same manner for convenience of illustration.

A third hole HL3 may be defined in the sub-base layer SBL. The third hole HL3 may be defined on a plane in a region overlapping the first hole HL1 and the second hole HL2. The third hole HL3 may be a hole extending from the upper surface of the sub-base layer SBL toward the lower surface of the sub-base layer SBL.

A sub-wiring layer SLL may be disposed under the sub-base layer SBL. The sub-wiring layer SLL may have a same layer structure as the wiring layer LL. The sub-wiring layer SLL may be a layer formed by a same process as the wiring layer LL.

A fourth hole HL4 may be defined in the sub-wiring layer SLL. The fourth hole HL4 may be defined on a region overlapping the first through third holes HL1, HL2, and HL3 on a plane. The fourth hole HL4 may be a hole extending from the upper surface of the sub-wiring layer SLL toward the lower surface of the sub-wiring layer SLL.

According to an embodiment of the invention, the first hole HL1, the second hole HL2, the third hole HL3 and the fourth hole HL4 may overlap each other on a plane. Thus, the upper surface of the uppermost wiring layer LL to the lower surface of the lowest sub-wiring layer SLL may be penetrated by the first hole HL1, the second hole HL2, the third hole HL3 and the fourth hole HL4. A through hole is defined by the first hole HL1, the second hole HL2, the third hole HL3, and the fourth hole HL4.

A conductive part CP may be disposed in the first hole HL1, the second hole HL2, the third hole HL3 and the fourth hole HL4. The conductive part CP may be disposed in the first hole HL1, the second hole HL2, the third hole HL3 and the fourth hole HL4 from the upper part of the wiring layer LL. A portion CPP of the conductive part CP may be disposed on the upper surface of the wiring layer LL. Thus, at least a portion of the upper surface of the wiring layer LL may be covered by a portion CPP of the conductive part CP. In such an embodiment, the contact between the wiring layer LL and the conductive part CP may be more stable, and the contact resistance between the wiring layer LL and the conductive part CP may be reduced since the contact area therebetween increases.

According to an embodiment of the invention, the conductive part CP extends through the first to fourth holes HL1, HL2, HL3 and HL4 to electrically connect a first structure disposed on the upper surface of the base layer BL and a second structure disposed on the lower surface of the base layer BL. Thus, in such an embodiment, a connection member for connecting the first structure and the second structure may be omitted, and the area for the connection member to be disposed in the base layer BL may be omitted. Therefore, in such an embodiment, the width of the non-display area NDA1 (see FIG. 2B) of the display module DMa may be reduced.

The image display element layer IDL may be disposed over the wiring layer LL. The image display element layer IDL may be a layer that operates to display an image. In an embodiment of the invention, the image display element layer IDL may include a light emitting diode ("LED") element, for example a tiny LED element. In an alternative embodiment of the invention, the image display element layer IDL may include organic LEDs, inorganic LEDs, or organic-inorganic hybrid LEDs. In another alternative embodiment of the invention, the image display element layer IDL may include liquid crystal molecules that control light transmission.

A cover layer CL may be disposed on the image display element layer IDL. The cover layer CL may serve to seal the image display element layer IDL. In one embodiment, for example, the cover layer CL may protect the image display element layer IDL from foreign substances such as moisture/oxygen or dust particles. The cover layer CL may have a laminate structure or be a substrate. In one embodiment, for example, the laminate structure may include at least one organic sealing layer and at least one inorganic sealing layer, which are alternately stacked one on another. The substrate may be a glass substrate or a plastic substrate.

The circuit member CM may be disposed under the base layer BL. The circuit member CM may supply a signal for controlling the image display element layer IDL. In one embodiment, for example, the circuit member CM may be a printed circuit board ("PCB"), a flexible printed circuit board ("FPCB"), a flexible film on which a driving chip is mounted, or a tape carrier package on which a driving chip is mounted.

The sub-base layer SBL and the circuit member CM may be disposed on the lower surface or a back surface BCS of the base layer BL. In an embodiment, an adhesive member (not shown) may be disposed between the back surface BCS of the sub-base layer SBL and the base layer BL and between the back surface BCS of the circuit member CM and the base layer BL. In one embodiment, for example, the adhesive member may be a double-sided tape.

In an embodiment, a connection conductive part CCP that connects the sub-wiring layer SLL and the circuit member CM may be disposed below the sub-wiring layer SLL and the circuit member CM. The connection conductive part CCP may include a conductive material. In one embodiment, for example, a conductive material may be printed on each of the sub-wiring layer SLL and the circuit member CM to form the connection conductive part CCP. Thus, the wiring layer LL may be electrically connected to the circuit member CM by the conductive part CP, the sub-wiring layer SLL and the connection conductive part CCP.

The conductive material may be, for example, a conductive ink or a conductive paste. The conductive ink may be a material in which conductive particles are mixed with ink, and the conductive paste may be a material in which conductive particles are dispersed in a fluid resin solution. The conductive particles may be, for example, organometallic complexes, metal powders or inorganic compounds, and may include, for example, copper, carbon, graphene, gold, silicon, platinum or quantum dots. However, the materials of the conductive particles described above are merely exemplary, and the conductive particles are not limited to the above examples.

The base layer BL may include a first alignment pattern AP1 and the sub-base layer SBL may include a second alignment pattern AP2. The first alignment pattern AP1 may be aligned with the second alignment pattern AP2 on a plane. The first alignment pattern AP1 may be printed on the base layer BL and the second alignment pattern AP2 may be printed on the sub-base layer SBL. The alignment between the base layer BL and the sub-base layer SBL may be performed with improved accuracy by the first alignment pattern AP1 and the second alignment pattern AP2.

Figure 4:
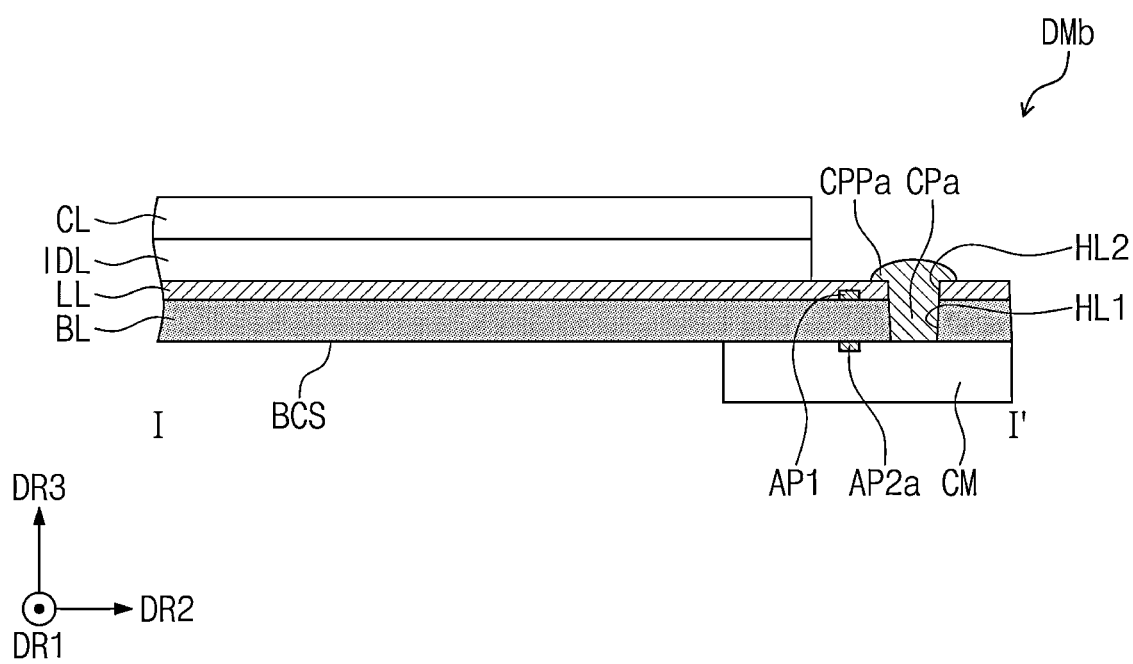
FIG. 4 is a cross-sectional view taken along line I-I' shown in FIG. 2B showing an alternative embodiment of the display module.

FIG. 4 is a cross-sectional view taken along line I-I' shown in FIG. 2B showing an alternative embodiment of the display module. In the description of FIG. 4, the same reference numerals are assigned to the same components as those described in FIG. 3, and any repetitive detailed description thereof will be omitted or simplified.

The display module DMb of FIG. 4 shows an alternative embodiment of the display module DM1 of FIG. 2B or the display modules DM of FIG. 2A. Each of the display modules DM in FIG. 2A may have a different size from the display module DM1 of FIG. 2B but may have substantially the same structure as the display module DM1 of FIG. 2B.

The display module DMb may include a base layer BL, a wiring layer LL, an image display element layer IDL, a circuit member CM, a cover layer CL, and a conductive part CPa.

In such an embodiment, as shown in FIG. 4, the sub-base layer SBL (see FIG. 3) and the sub-wiring layer SLL (see FIG. 3) may be omitted in FIG. 4.

The conductive part CPa may be disposed in the first hole HL1 and the second hole HL2 from the upper part of the wiring layer LL. A through hole is defined by the first hole HL1 and the second hole HL2. A portion CPPa of the conductive part CPa may be disposed on the upper surface of the wiring layer LL. Thus, at least a portion of the upper surface of the wiring layer LL may be covered by the portion CPPa of the conductive part CPa.

The circuit member CM is disposed under the base layer BL and may be disposed in a region overlapping the conductive part CPa on the plane or when viewed from the plan view in the thickness direction of the display module. Therefore, the circuit member CM may be electrically connected to the wiring layer LL through the conductive part CPa.

The base layer BL may include a first alignment pattern AP1 and the circuit member CM may include a second alignment pattern AP2a. The second alignment pattern AP2a may be aligned corresponding to the first alignment pattern AP1. The first alignment pattern AP1 may be printed on the base layer BL and the second alignment pattern AP2a may be printed on the circuit member CM. The alignment between the base layer BL and the sub-base layer SBL may be performed with improved accuracy by the first alignment pattern AP1 and the second alignment pattern AP2.

Figure 5A:
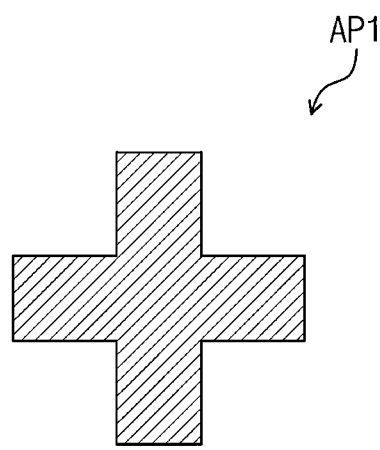
FIG. 5A is a plan view showing a first alignment pattern shown in FIGS. 3 and 4.
Figure 5B:
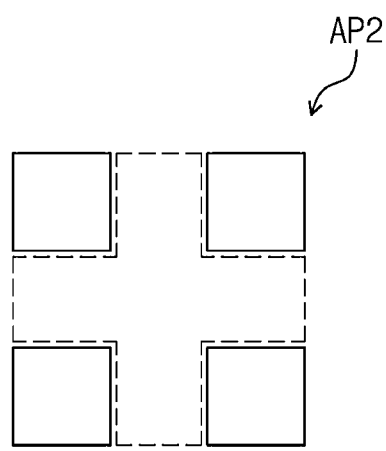
FIG. 5B is a plan view showing a second alignment pattern shown in FIGS. 3 and 4.

FIG. 5A is a plan view showing the first alignment pattern shown in FIGS. 3 and 4, and FIG. 5B is a plan view showing the second alignment pattern shown in FIGS. 3 and 4.

In an embodiment, as shown in FIG. 5A, the first alignment pattern AP1 may have a cross shape. The second alignment pattern AP2 may have a shape corresponding to the shape of the first alignment pattern AP1 such that the first alignment pattern AP1 may be aligned with the second alignment pattern AP2. In one embodiment, for example, the second alignment pattern AP2 may include four rectangular shapes arranged to be disposed around the first alignment pattern AP1, as shown in FIG. 5B.

The shapes of the first and second alignment patterns AP1 and AP2 described with reference to FIGS. 5A and 5B are merely exemplary, and the shapes of the first and second alignment patterns AP1 and AP2 may be variously modified. In one embodiment, for example, the shapes of the first and second alignment patterns AP1 and AP2 may be reversed, that is, the first and second alignment patterns AP1 and AP2 may have the shapes shown in FIGS. 5B and 5A, respectively. In an alternative embodiment, the first alignment pattern AP1 may have a circular or polygonal shape, and the second alignment pattern AP2 has a shape corresponding to the shape of the first alignment pattern AP1 as long as the second alignment pattern AP2 has a shape that may be aligned with the circular or polygonal first alignment pattern AP1. In one embodiment, for example, the second alignment pattern AP2 on the plane (or when viewed from the plan view in the thickness direction of the display module) may have a shape that does not overlap with the first alignment pattern AP1.

Figure 6:
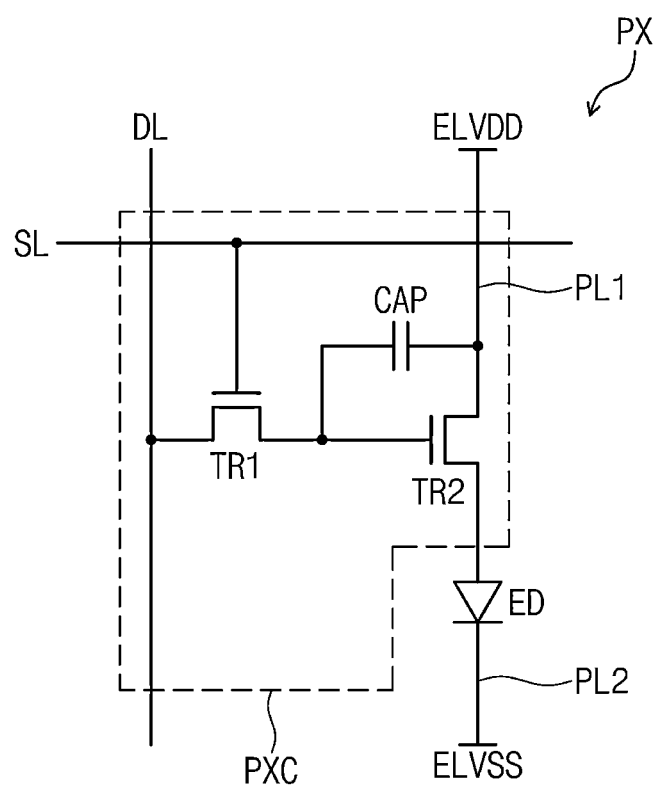
FIG. 6 is a circuit diagram showing a pixel according to an embodiment of the invention.

FIG. 6 is a circuit diagram showing a pixel according to an embodiment of the invention.

Referring to FIG. 6, in an embodiment, the pixel PX may be connected to a plurality of signal lines. In such an embodiment, among the signal lines, the scan lines SL, the data lines DL, the first power line PL1, and the second power line PL2, as shown in FIG. 6. However, this is merely exemplary, and the pixel PX may be additionally connected to various signal lines and is not limited to a specific configuration.

The pixel PX may include an image display element ED and a pixel circuit PXC. The pixel circuit PXC may include a first thin film transistor TR1, a capacitor CAP, and a second thin film transistor TR2.

The first thin film transistor TR1 may be a switching transistor for controlling ON-OFF of the pixel PX. The first thin film transistor TR1 may transmit or block a data signal transmitted through the data line DL in response to a gate signal transmitted through the scan line SL.

The capacitor CAP is connected to the first thin film transistor TR1 and the first power line PL1. The capacitor CAP charges an amount of charge corresponding to the difference between the data signal transferred from the first thin film transistor TR1 and the first power supply voltage ELVDD applied to the first power line PL1.

The second thin film transistor TR2 is connected to the first thin film transistor TR1, the capacitor CAP and the image display element ED. The second thin film transistor TR2 controls the driving current flowing in the image display element ED in correspondence to the amount of charge stored in the capacitor CAP. The turn-on time of the second thin film transistor TR2 may be determined by the amount of charge charged in the capacitor CAP. The second thin film transistor TR2 provides the first power supply voltage ELVDD transmitted through the first power line PL1 to the image display element ED during the turn-on time.

The image display element ED is connected to the second thin film transistor TR2 and the second power line PL2. The image display element ED emits light at a voltage corresponding to the difference between the signal transmitted through the second thin film transistor TR2 and the second power supply voltage ELVSS received through the second power line PL2.

The image display element ED includes a light emitting material. The image display element ED may generate light of a color corresponding to the light emitting material. The color of the light generated in the image display element ED may be any one of red, green, blue, and white.

In an embodiment, each of the first thin film transistor TR1 and the second thin film transistor TR2 may be an N-type thin film transistor or a P-type thin film transistor. In one alternative embodiment, for example, one of the first thin film transistor TR1 and the second thin film transistor TR2 may be an N-type thin film transistor and the other of the first thin film transistor TR1 and the second thin film transistor TR2 may be a P-type thin film transistor.

Figure 7A:
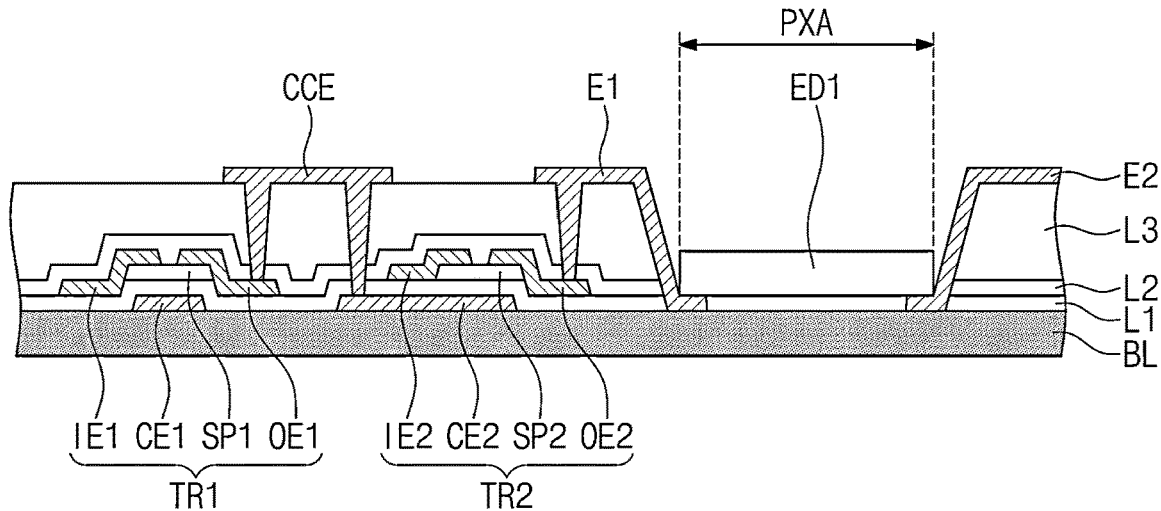
FIG. 7A is a cross-sectional view of a pixel according to an embodiment of the invention.

FIG. 7A is a cross-sectional view of a pixel according to an embodiment of the invention.

Referring to FIGS. 6 and 7A, the image display element ED is a micro-sized LED element ED1. In one embodiment, the micro-sized LED element ED1 may be an LED element having a size in a range from several nanometers to several hundreds of micrometers. However, the size of the micro-sized LED element ED1 described above is merely exemplary, and the size of the micro-sized LED element ED1 is not limited to the above-mentioned numerical range.

FIG. 7A is a cross-sectional view showing a first thin film transistor TR1, a second thin film transistor TR2, and a micro-sized LED element ED1.

The first thin film transistor TR1 may include a first control electrode CE1, a first input electrode IE1, a first output electrode OE1 and a first semiconductor pattern SP1. The second thin film transistor TR2 may include a second control electrode CE2, a second input electrode IE2, a second output electrode OE2 and a second semiconductor pattern SP2.

The first control electrode CE1 and the second control electrode CE2 may be disposed on the base layer BL. The first control electrode CE1 and the second control electrode CE2 may include a metal.

The first insulating layer L1 may be disposed on the base layer BL and may cover the first control electrode CE1 and the second control electrode CE2. In an embodiment, the first control electrode CE1 and the second control electrode CE2 may be disposed between the first insulating layer L1 and the base layer BL.

The first semiconductor pattern SP1 and the second semiconductor pattern SP2 may be disposed on the first insulating layer L1. The first semiconductor pattern SP1 may be spaced apart from the first control electrode CE1 on the cross section or in a thickness direction of the base layer BL, and the second semiconductor pattern SP2 may be spaced apart from the second control electrode CE2 on the cross section or in a thickness direction of the base layer BL.

Each of the first and second semiconductor patterns SP1 and SP2 may include a semiconductor material. In one embodiment, For example, the first semiconductor pattern SP1 and the second semiconductor pattern SP2 may include a same semiconductor material as each other. Alternatively, the first semiconductor pattern SP1 and the second semiconductor pattern SP2 may include different semiconductor materials from each other. The semiconductor material may include at least one selected from amorphous silicon, polycrystalline silicon, single crystal silicon, an oxide semiconductor, and a compound semiconductor.

A first input electrode IE1 and a first output electrode OE1 are disposed on the first semiconductor pattern SP1, and a second input electrode IE2 and a second output electrode OE2 may be disposed on the second semiconductor pattern SP2.

A second insulating layer L2 may be disposed over the first insulating layer L1, and may cover the first and second semiconductor patterns SP1 and SP2, the first and second input electrodes IE1 and IE2, and the first and second output electrodes OE1 and OE2. In an embodiment, the first and second semiconductor patterns SP1 and SP2, the first and second input electrodes IE1 and IE2, and the first and second output electrodes OE1 and OE2 may be disposed between the first insulating layer L1 and the second insulating layer L2.

A third insulating layer L3 may be disposed on the second insulating layer L2. In one embodiment, for example, the first insulating layer L1 and the second insulating layer L2 may include an inorganic material, and the third insulating layer L3 may include an organic material. The third insulating layer L3 may have a flat upper surface to provide a flat surface on layers therebelow.

A connection electrode CCE that connects the first output electrode OE1 and the second control electrode CE2 may be disposed on the third insulating layer L3. In an embodiment, through holes may be defined in the second and third insulating layers L2 and L3, and a portion of the first output electrode OE1 may be exposed through the through holes. The connection electrode CCE may be electrically connected to the exposed portion of the first output electrode OE1. Through holes are defined through the first to third insulating layers L1, L2 and L3, and a portion of the second control electrode CE2 may be exposed through the through holes. The connection electrode CCE may be electrically connected to the exposed portion of the second control electrode CE2.

The first electrode E1 may be disposed on the third insulating layer L3. Through holes are defined in the second and third insulating layers L2 and L3, and a portion of the second output electrode OE2 may be exposed through the through holes. The first electrode E1 may be electrically connected to the exposed portion of the second output electrode OE2.

The second electrode E2 may be disposed on the third insulating layer L3. The second electrode E2 may be electrically connected to the second power line PL2 (see FIG. 6), to receive the second power supply voltage ELVSS.

In an embodiment, the first electrode E1 and the second electrode E2 may include a same material, e.g., a conductive material, as each other. In one embodiment, for example, the conductive material may include at least one selected from indium zinc oxide ("IZO"), indium tin oxide ("ITO"), indium gallium oxide ("IGO"), indium zinc gallium oxide ("IGZO"), and a combination (e.g., a mixture/or a compound) thereof. However, the invention is not limited thereto. In one alternative embodiment, for example, the conductive material may be a metallic material. The metallic material may include, for example, molybdenum, silver, titanium, copper, aluminum, or alloys thereof.

A micro-sized LED element ED1 may be disposed on the first electrode E1 and the second electrode E2. The micro-sized LED element ED1 may be electrically connected to the first electrode E1 and the second electrode E2. The pixel emission region PXA may be defined as an area corresponding to an area where the micro-sized LED element ED1 is disposed.

Figure 7B:
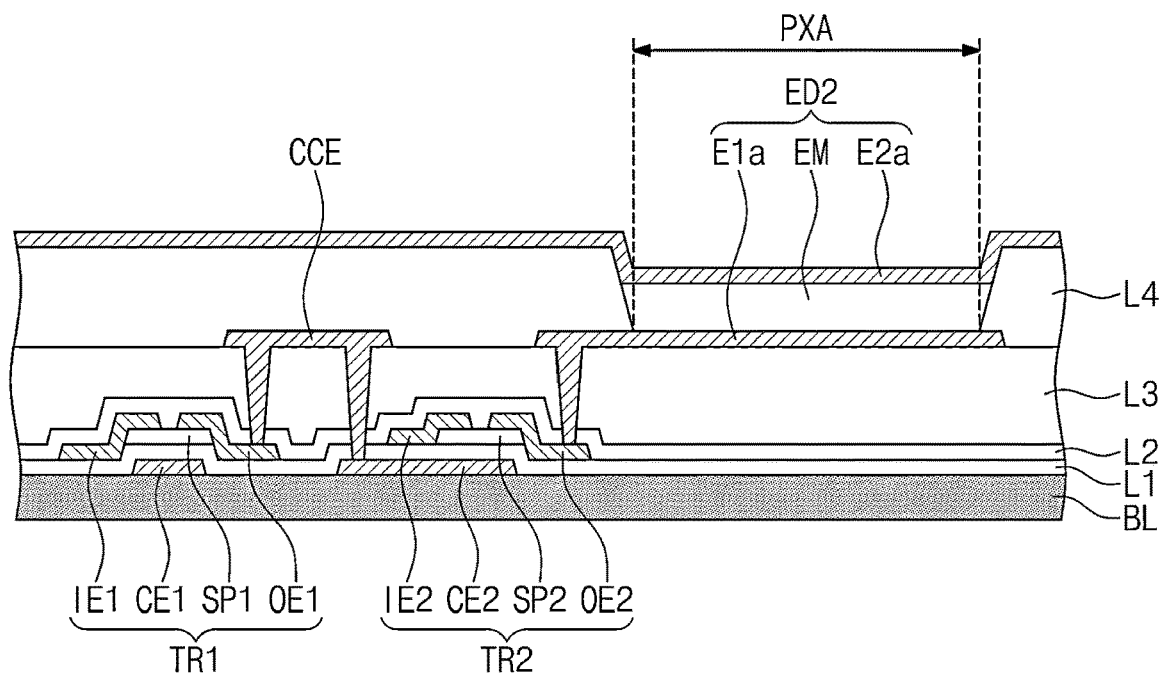
FIG. 7B is a cross-sectional view of a pixel according to an alternative embodiment of the invention.

FIG. 7B is a cross-sectional view of a pixel according to an alternative embodiment of the invention. In the description of FIG. 7B, the same reference numerals are given to the components described with reference to FIG. 7A, and any repetitive detailed description thereof will be omitted or simplified.

Referring to FIGS. 6 and 7B, the image display element ED is a light emission element ED2. The light emission element ED2 may be, for example, an organic light emission element.

The light emission element ED2 may include a first electrode E1a, a light emission layer EM, and a second electrode E2a.

The first electrode E1a may be disposed on the third insulating layer L3. Through holes are defined in the second and third insulating layers L2 and L3, and a portion of the second output electrode OE2 may be exposed through the through holes. The first electrode E1a may be electrically connected to the exposed portion of the second output electrode OE2.

In such an embodiment, as shown in FIG. 7B, a fourth insulating layer L4 may be disposed on the third insulating layer L3. The fourth insulating layer L4 may cover a portion of the first electrode E1a and may expose another portion of the first electrode E1a. The fourth insulating layer L4 may be a pixel definition layer. A pixel light emission area PXA may be defined corresponding to the first electrode E1a exposed by the fourth insulating layer L4.

The light emission layer EM is disposed on the first electrode E1a. The light emission layer EM may include a luminescent material. In one embodiment, for example, the light emission layer EM may include at least one of materials for emitting red, green or blue light, and may include a fluorescent material or a phosphorescent material. The light emission layer EM may emit light in response to a potential difference between the first electrode E1a and the second electrode E2a.

The second electrode E2a is disposed on the light emission layer EM. The second electrode E2a may be opposite to, e.g., face, the first electrode E1a. The second electrode E2a may be electrically connected to the second power line PL2 of FIG. 6. The light emission element ED2 may receive a second power supply voltage ELVSS through the second electrode E2a.

The second electrode E2a may include a transmissive conductive material or a transflective conductive material, such that the light generated in the light emission layer EM may be effectively emitted through the second electrode E2a.

In an embodiment, although not shown in the drawing, the light emission element ED2 may further include at least one organic layer or at least one inorganic layer, which is disposed at least one of between the light emission layer EM and the first electrode E1a and between the light emission layer EM and the second electrode E2a. The organic layer or the inorganic layer controls the movement of charges or electrons flowing into the light emission layer EM from the first electrode E1a and the second electrode E2a to improve the light efficiency and lifetime of the light emission element ED2.

FIGS. 8A to 8K are cross-sectional views showing a part of a manufacturing process of a display module according to an embodiment of the invention. FIGS. 8A to 8K schematically show a manufacturing process of a display module having the pixels described in FIG. 7A.

Figure 8A:
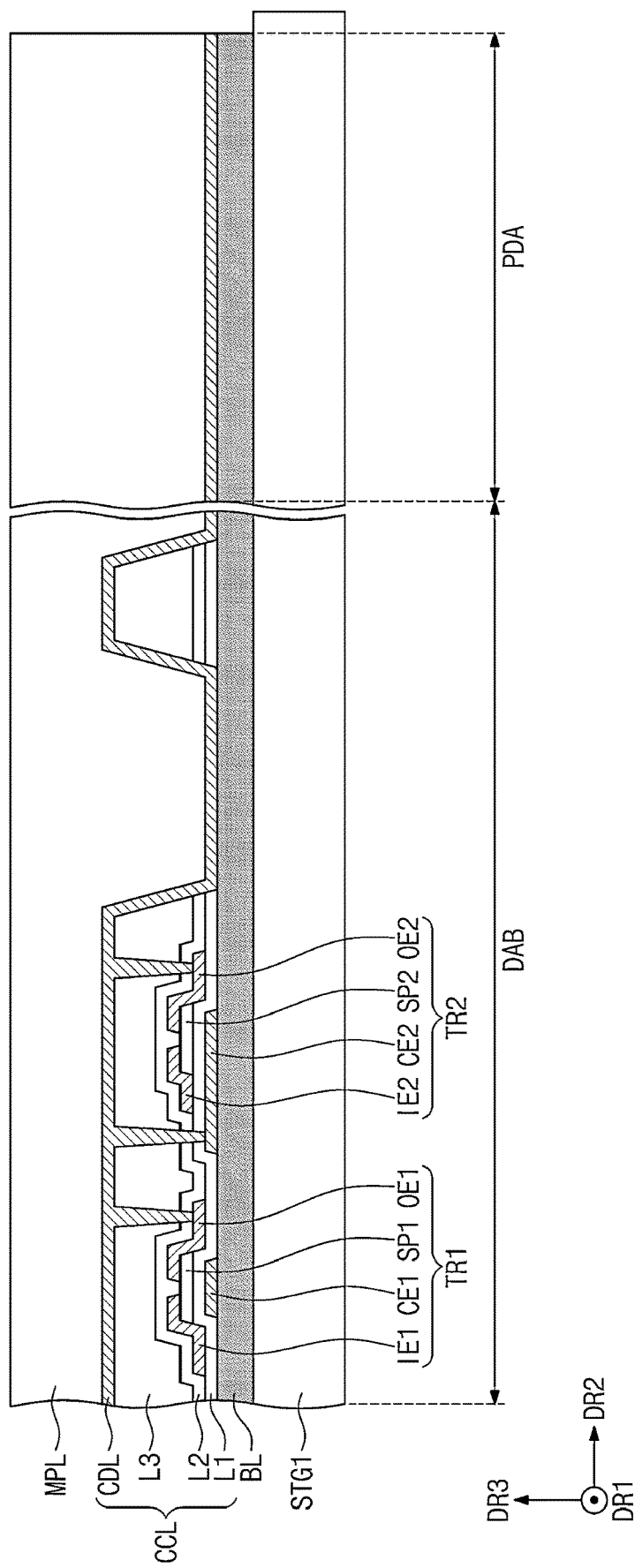
FIGS. 8A to 8K are cross-sectional views showing a part of a manufacturing process of a display module according to an embodiment of the invention.

Referring to FIG. 8A, a base layer BL is provided, e.g., formed, on a carrier substrate STG1. The carrier substrate STG1 may be, for example, a glass substrate.

A display area DAB and a pad area PDA may be defined in the base layer BL. The circuit layer CLL is provided or formed on the display area DAB and the pad area PDA of the base layer BL. The circuit layer CLL may include a plurality of conductive layers, a plurality of insulating layers, and a semiconductor layer. In one embodiment, for example, the plurality of conductive layers may include a first control electrode CE1, a first input electrode IE1, a first output electrode OE1, a second control electrode CE2, a second input electrode IE2, a second output electrode OE2, a wiring layer LL, and a conductive layer CDL. The plurality of insulating layers may include first to third insulating layers L1, L2, and L3. The semiconductor layer may include a first semiconductor pattern SP1 and a second semiconductor pattern SP2.

The wiring layer LL may be a layer provided or formed through a same process as the conductive layer CDL and including a same material as the conductive layer CDL. However, the invention is not limited thereto. In one alternative embodiment, for example, the wiring layer LL may be provided or formed through a same process as the first control electrode CE1, and may be a layer including a same material as the first control electrode CE1. In another alternative embodiment of the invention, the wiring layer LL may be provided or formed through a same process as the first input electrode IE1, and may be a layer including a same material as the first input electrode IE1.

A first mask layer MPL is provided or formed on the upper surface of the circuit layer CCL. The first mask layer MPL may be a polymer layer. In one embodiment, for example, the first mask layer MPL may be a photoresist layer that is exposed to light or heat to change resistance.

Figure 8B:
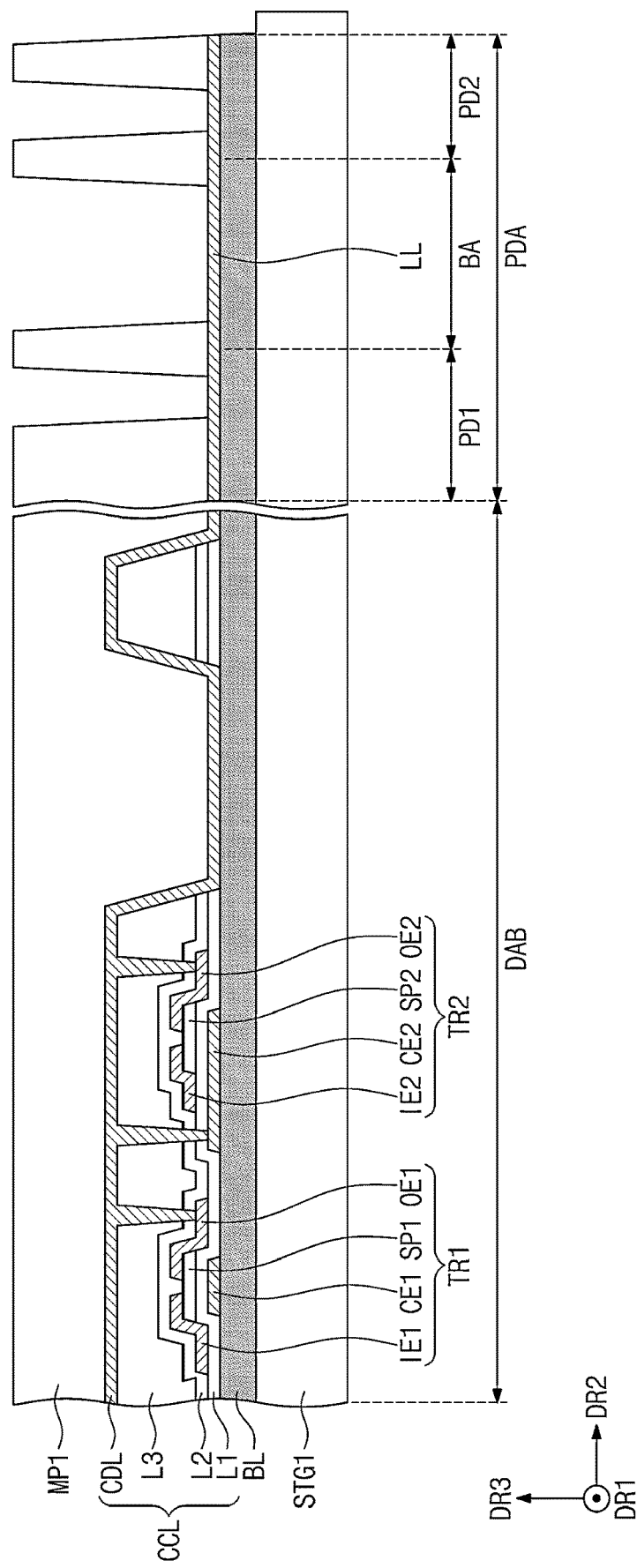

Referring to FIG. 8B, a first mask pattern MP1 is provided or formed by patterning the first mask layer MPL (see FIG. 8A). In one embodiment, for example, at least a portion of the first mask layer MPL disposed on the pad area PDA may be removed to form the first mask pattern MP1. The first mask pattern MP1 may be a photoresist pattern.

Figure 8C:
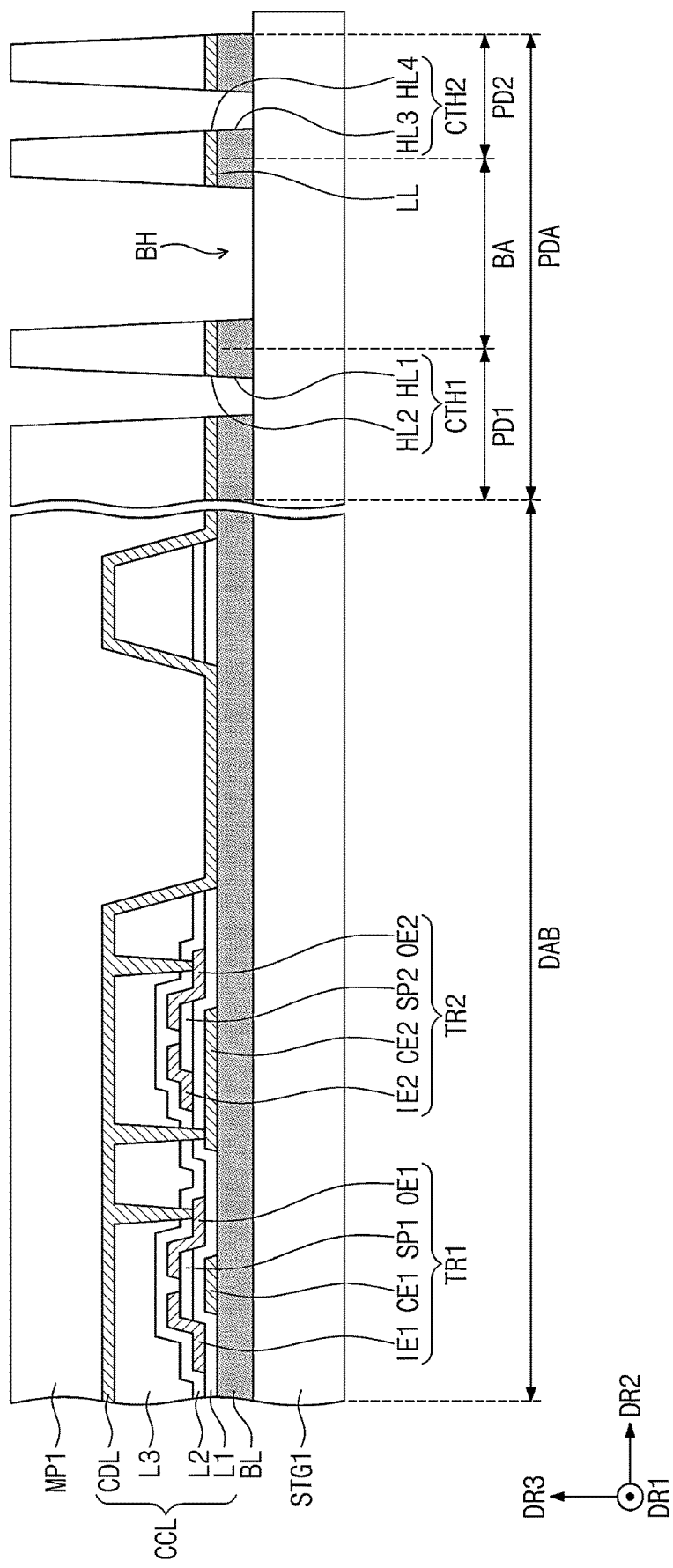

Referring to FIG. 8C, holes may be formed in the wiring layer LL and the base layer BL using the first mask pattern MP1. A wet etching process or a dry etching process may be used to form holes in the wiring layer LL and the base layer BL.

A first pad area PD1, a bending area BA, and a second pad area PD2 may be defined in the pad area PDA. A bending area BA may be defined between the first pad area PD1 and the second pad area PD2.

By using the first mask pattern MP1, a first contact hole CTH1 may be formed in the first pad area PD1, a second contact hole CTH2 may be formed in the second pad area PD2, and at least a portion of the bending area BA may be removed.

In such an embodiment, the first contact hole CTH1 is defined by the first hole HL1 and the second hole HL2 and the second contact hole CTH2 is defined by the third hole HL3 and the fourth hole HL4. When viewed from the plan view in the thickness direction of the display module, the first hole HL1 and the second hole HL2 may overlap each other and the third hole HL3 and the fourth hole HL4 may overlap each other. A bending hole BH may be defined in the bending area BA.

Figure 8D:
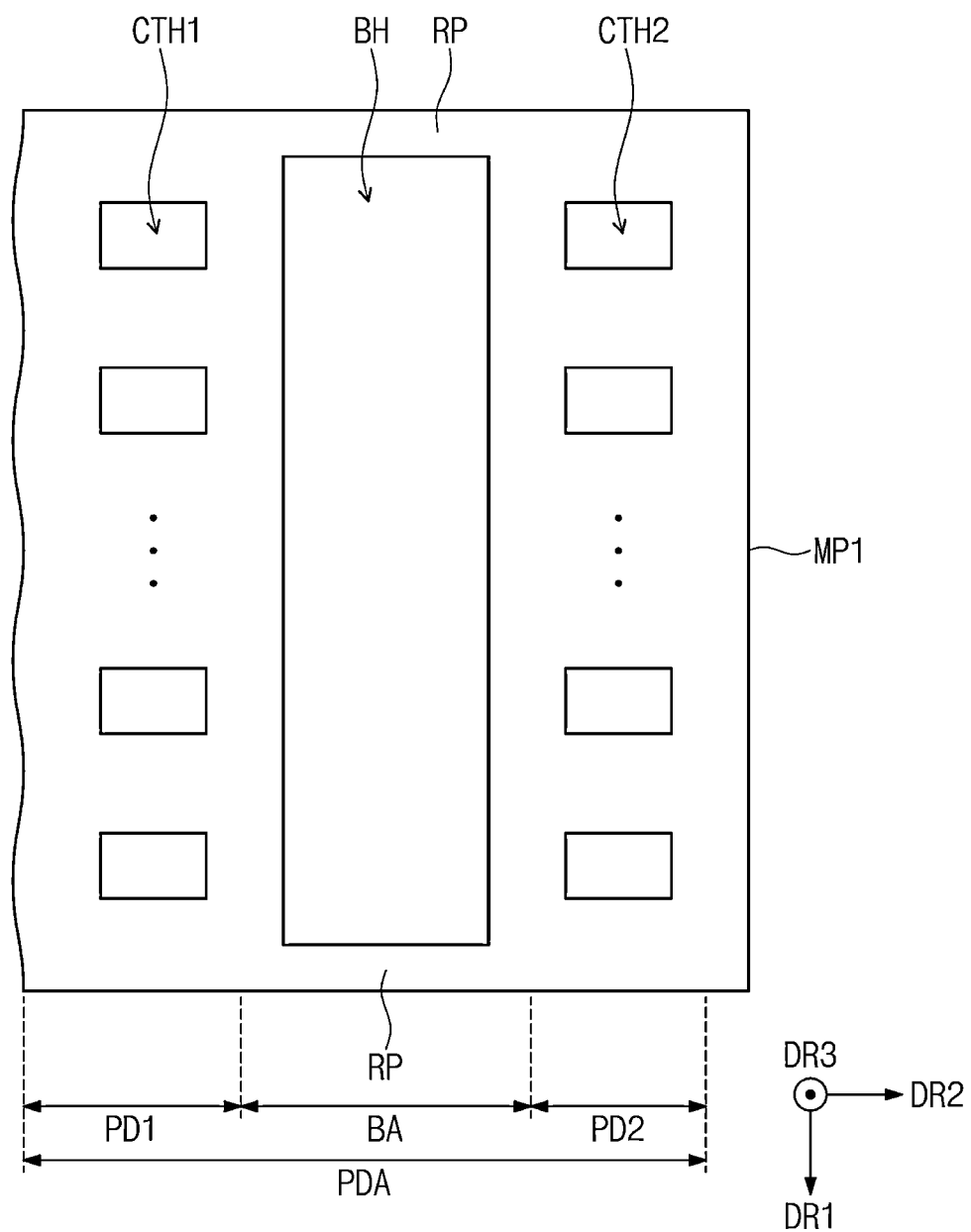

Referring to FIG. 8D, a plan view of a first mask pattern MP1 disposed in a pad area PDA is shown. For better understanding, the first contact holes CTH1, the second contact holes CTH2, and the bending holes BH formed by the first mask pattern MP1 are also illustrated.

In such an embodiment, as shown in FIG. 8D, the bending hole BH may be an area corresponding to a portion removed from the bending area BA. There may be portions not removed in the peripheral portion of the bending hole BH of the bending area BA. The portion not removed around the bending hole BH is referred to as a remaining portion RP. The first pad area PD1 and the second pad area PD2 may be connected to each other by the remaining portion RP.

Referring again to FIG. 8C, after the first contact holes CTH1, the second contact holes CTH2, and the bending holes BH are formed, the first mask pattern MP1 is removed. After removing the first mask pattern MP1, a second mask layer (not shown) is formed on the circuit layer CCL. The second mask layer may be in a substantially same form as the first mask layer MPL shown in FIG. 8A. The second mask layer may be a polymer layer. In one embodiment, for example, the second mask layer may be a photoresist layer that is exposed to light or heat to change resistance.

Figure 8E:
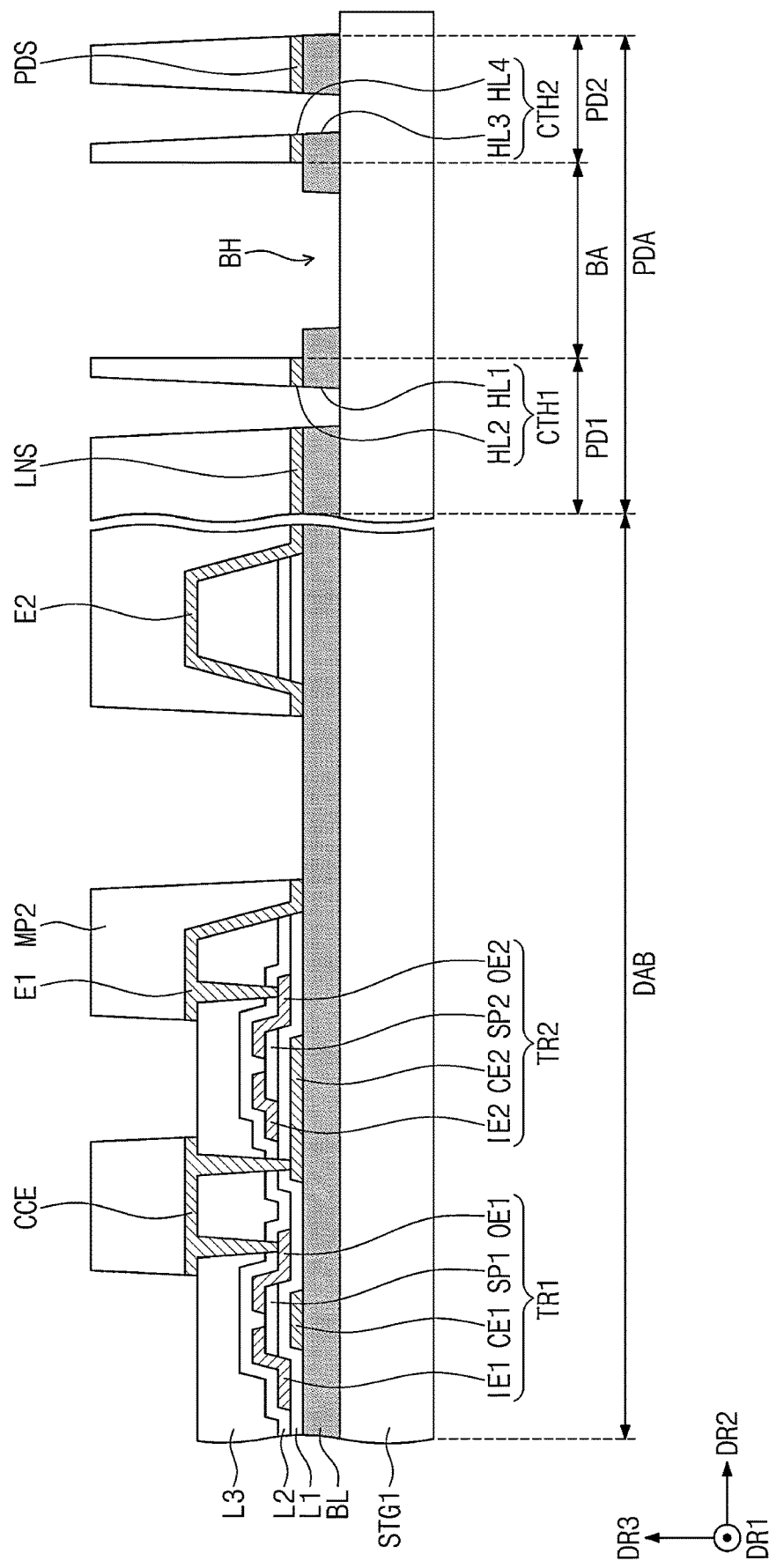

Referring to FIG. 8E, the second mask layer is patterned to form a second mask pattern MP2. In one embodiment, for example, at least a portion of the second mask layer disposed over the display area DAB and the pad area PDA may be removed to form the second mask pattern MP2. The second mask pattern MP2 may be a photoresist pattern.

The wiring layer LL and the conductive layer CDL are patterned using the second mask pattern MP2. The connection electrode CCE, the first electrode E1 and the second electrode E2 may be formed by patterning the conductive layer CDL (see FIG. 8C). A wet etching process may be used to form the connection electrode CCE, the first electrode E1 and the second electrode E2. However, this is merely exemplarily, and alternatively, a dry etching process may be used to from the connection electrode CCE, the first electrode E1 and the second electrode E2.

Figure 8F:
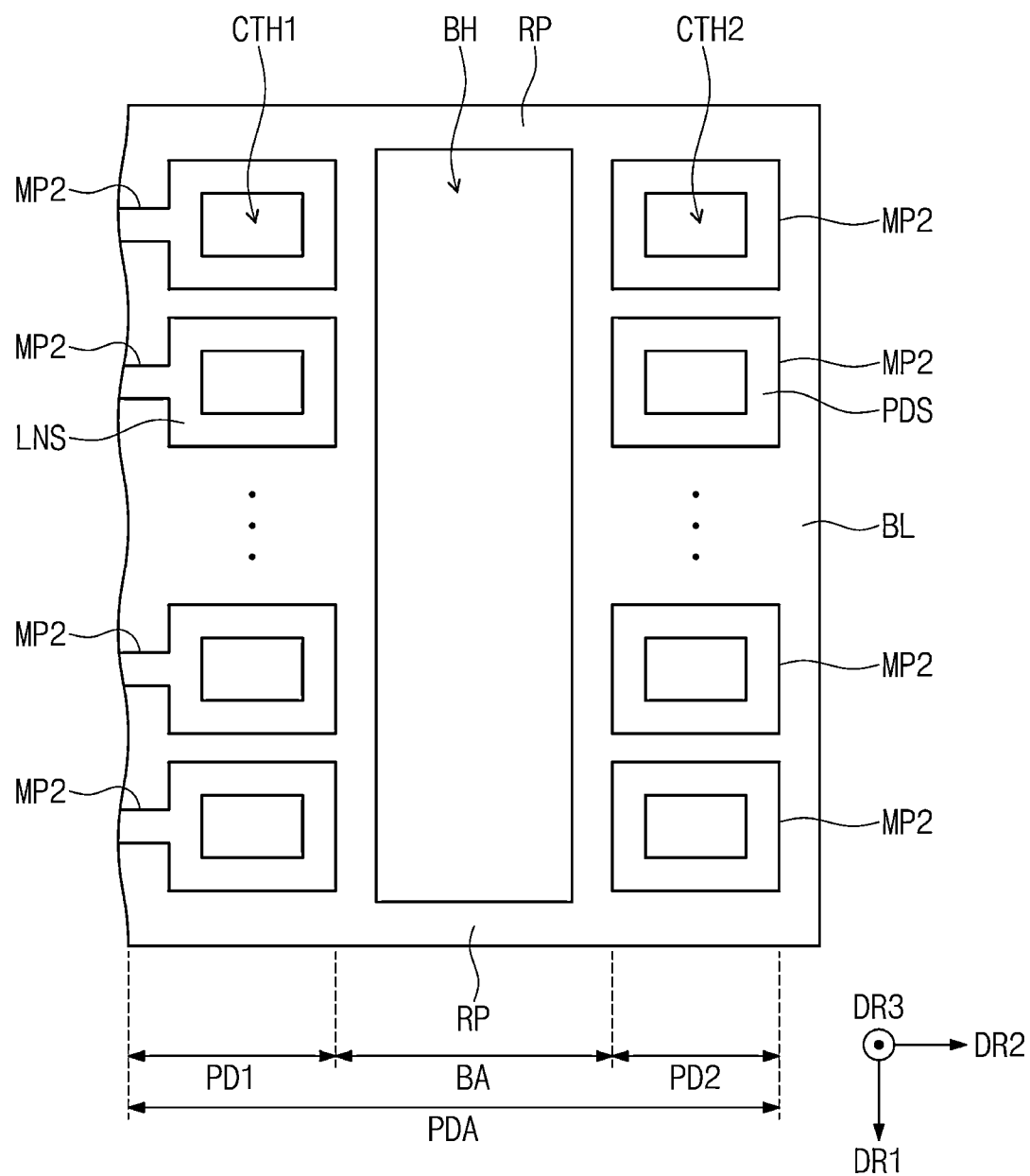

In such an embodiment, the wiring lines LNS and pads PDS may be formed by patterning the wiring layer LL (see FIG. 8C). The patterned wiring layer LL may include wiring lines LNS and pads PDS. Referring to FIG. 8F, a plan view of a second mask pattern MP2 disposed in a pad area PDA is shown.

When viewed from the plan view in the thickness direction of the display module, the second mask pattern MP2 may have a shape corresponding to the shape of the wiring lines LNS and the pads PDS of the wiring layer LL (see FIG. 8C). For better understanding, reference numerals of wiring lines LNS and pads PDS formed by the second mask pattern MP2 are also illustrated.

Hereinafter, in FIGS. 8G, 8H, 8I, and 8J, a portion not disposed on a same cross-sectional plane is shown by a dotted line. For example, the dotted line shown in the bending area BA may be the remaining portion RP described above with reference to FIG. 8D.

Figure 8G:
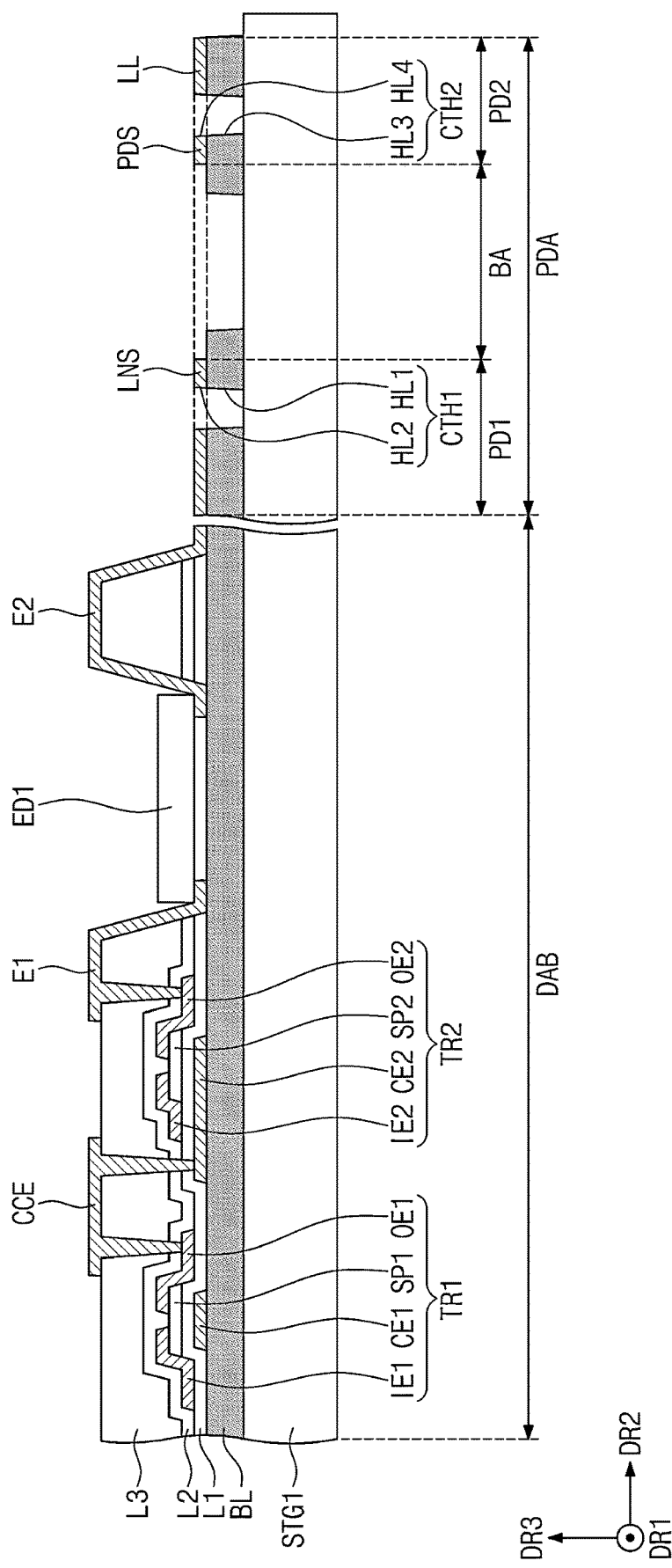

Referring to FIG. 8G, after removing the second mask pattern MP2 (see FIG. 8F), the micro-sized LED element ED1 is transferred to the first electrode E1 and the second electrode E2. In one embodiment, for example, a plurality of micro-sized LED elements may be transferred simultaneously, or a single micro-sized LED element may be transferred.

The method of transferring the micro-sized LED element ED1 to the first electrode E1 and the second electrode E2 may include a direct transfer method or a print transfer method. The direct transfer method may be a method of transferring the micro-sized LED element ED1 directly to the first electrode E1 and the second electrode E2. The print transfer method may be a method of transferring the micro-sized LED element ED1 to the first electrode E1 and the second electrode E2 using an electrostatic head, a flat stamp, or a roll stamp.

Figure 8H:
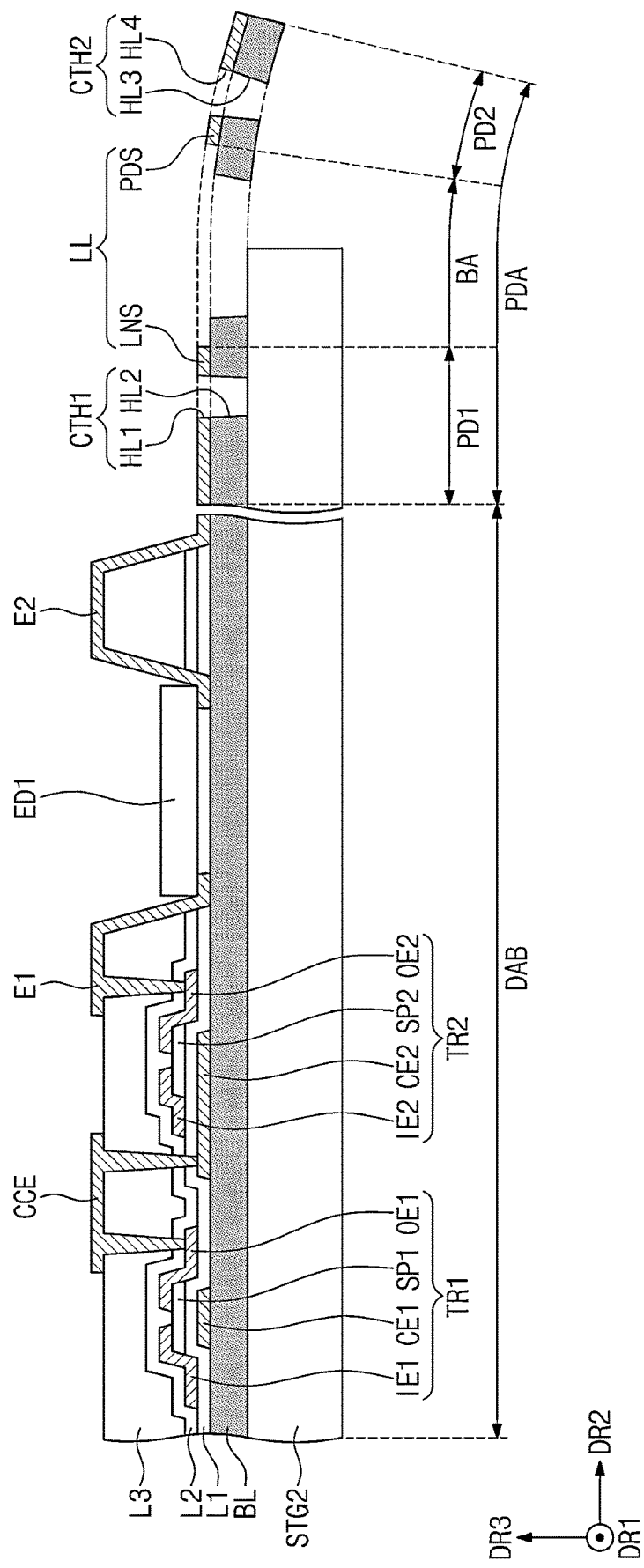

Referring to FIG. 8H, the base layer BL is moved to the bending jig STG2. Although not shown in the drawing, a protective film (not shown) for protecting the circuit layer CLL may be further provided on the circuit layer CLL.

The bending area BA of the base layer BL may be bent in a way such that the first contact hole CTH1 and the second contact hole CTH2 overlap.

After bending, the second pad area PD2 disposed under the first pad area PD1 may defined a sub-base layer SBL (see FIG. 3) and the wiring layer LL disposed on the base layer BL of the second pad area PD2 may define a sub-wiring layer SLL (see FIG. 3).

Figure 8I:
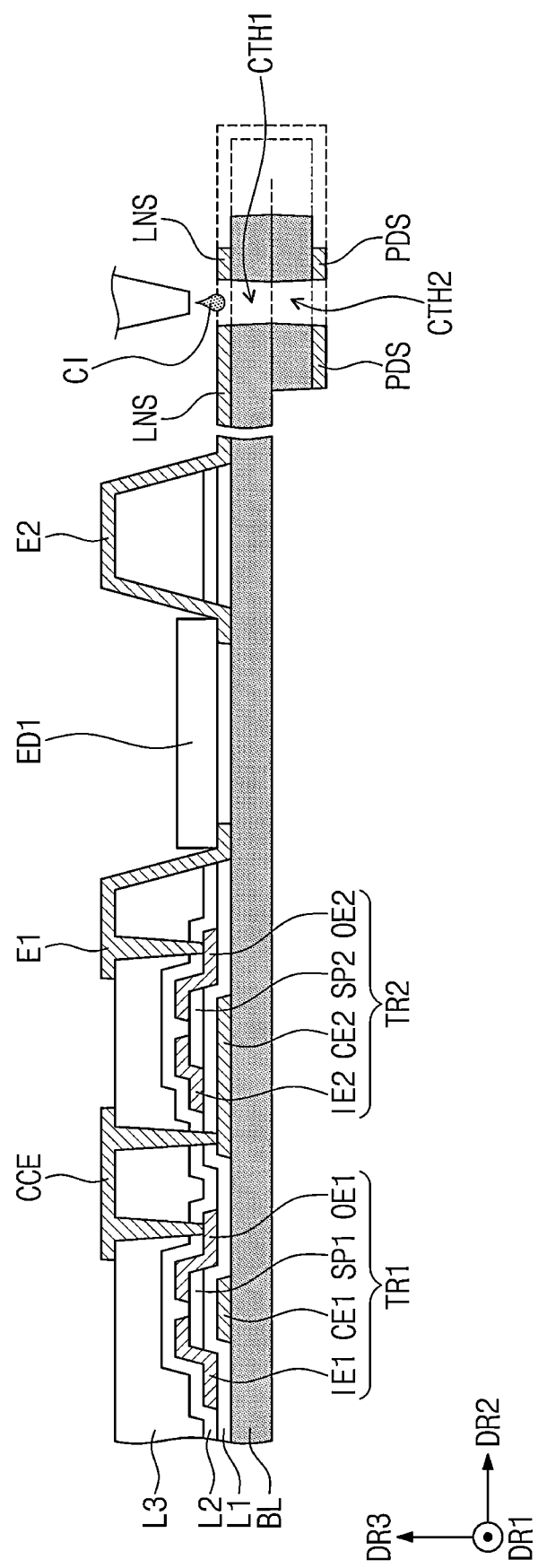
Figure 8J:
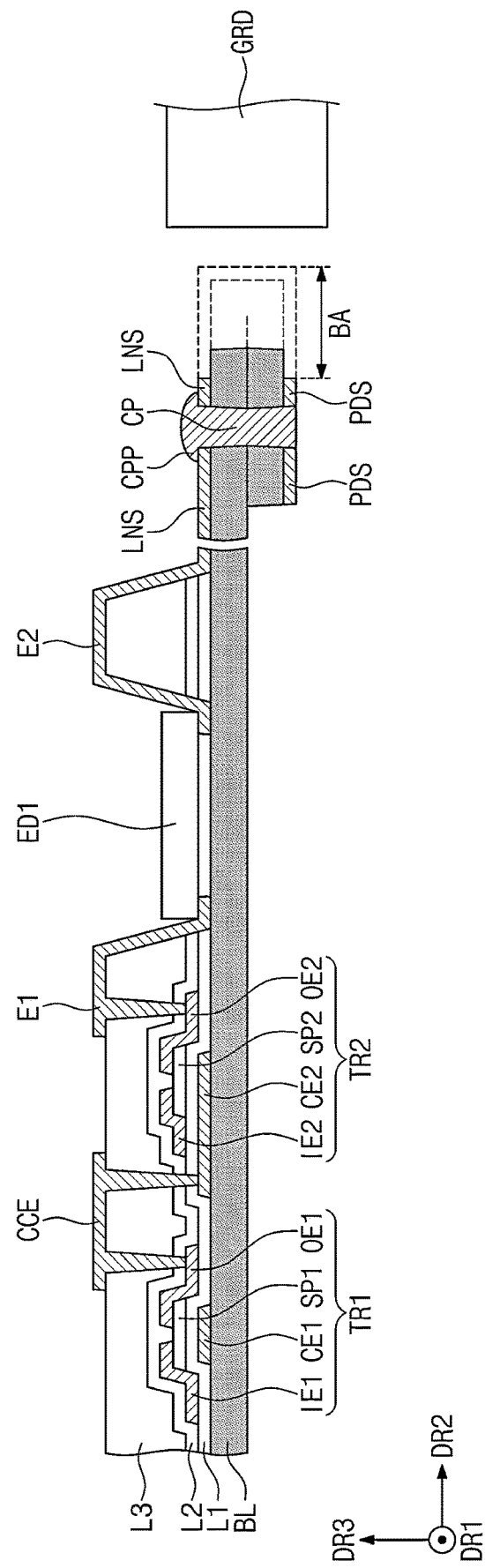

Referring to FIGS. 8I and 8J, a conductive material CI is provided in a first contact hole CTH1 and a second contact hole CTH2 overlapping each other on a plane. The through hole is defined by the first contact hole CTH1 and the second contact hole CTH2. The conductive material CI may be, for example, a conductive ink or a conductive paste. Each of the conductive ink and the conductive paste may include conductive particles. In one embodiment, For example, the conductive particles may be organometallic complexes, metal powders or inorganic compounds, and may include, for example, copper, carbon, graphene, gold, silicon, platinum or quantum dots, but not being limited thereto.

A conductive material CI is provided, e.g., injected, in the first and second contact holes CTH1 and CTH2 and then the conductive material CI is cured to form a conductive part CP. The curing may be a thermal curing, a dry curing, or a ultraviolet ("UV") curing, but not being limited thereto.

The conductive part CP may electrically connect the wiring lines LNS and the pads PDS corresponding one-to-one to the wiring lines LNS. Being disposed in the first contact hole CTH1 may mean filling the empty space defined by the first contact hole CTH1.

According to an embodiment of the invention, a target to be connected (e.g., the wiring lines LNS and the pads PDS) is formed and then a conductive part CP is formed. Thus, at least a portion of the upper surface of the wiring lines LNS may be covered by a portion CPP of the conductive part CP. In such an embodiment, the contact area may be more stable because the contact area between the wiring lines LNS and the conductive part CP increases. In such an embodiment, the contact resistance between the wiring lines LNS and the conductive part CP may be reduced. In an alternative embodiment of the invention, a portion of the pads PDS may have a shape covered by a portion of the conductive part CP.

As shown in FIG. 8J, the bending area BA may be ground by a grinder GRD. However, this is merely exemplary, and the alternatively, bending area BA may be removed by a laser or may be removed by a knife.

Figure 8K:
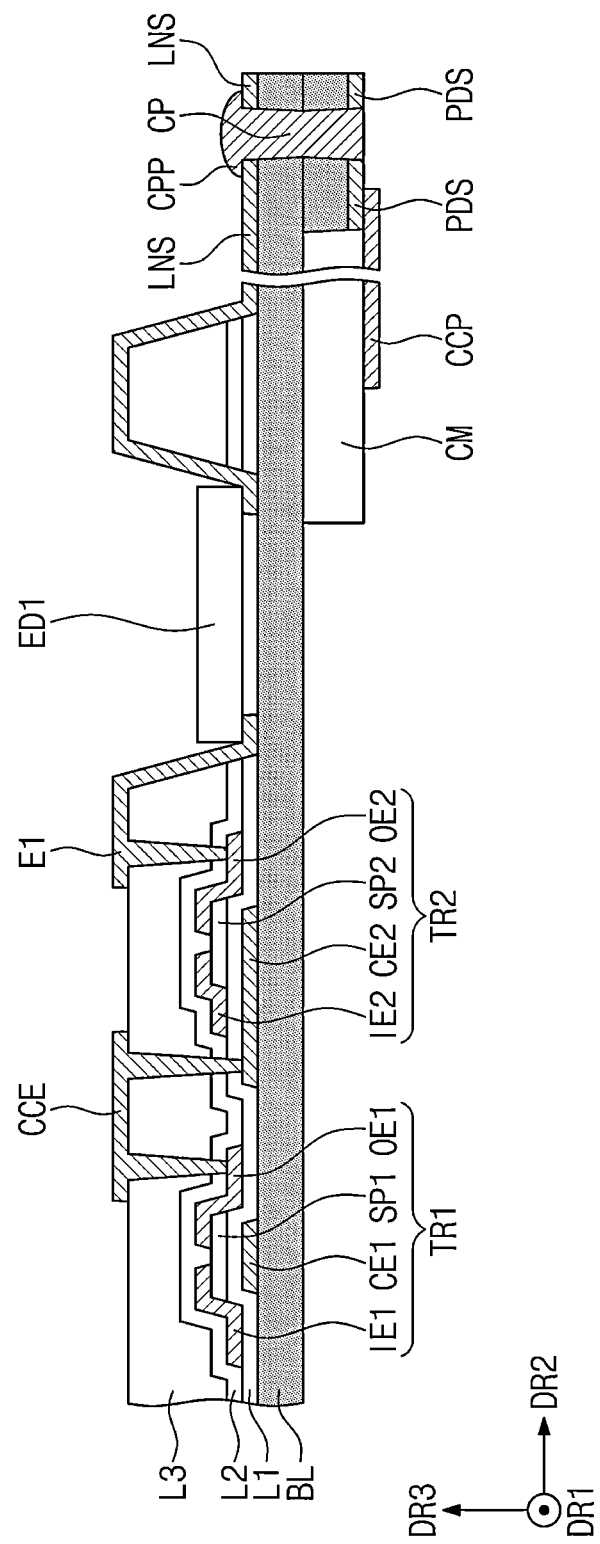

Referring to FIG. 8K, a circuit member CM is provided on the back surface of the base layer BL. In an embodiment, a conductive material may be printed on each of the circuit member CM and the pads PDS to electrically connect the circuit member CM and the pads PDS. Accordingly, a connection conductive part CCP connecting the circuit member CM and the pads PDS may be formed.

In an embodiment of the invention, as described above, the bending area BA (see FIG. 8J) is removed prior to providing the circuit member CM, the invention is not limited thereto. In one alternative embodiment, for example, the bending area BA may be removed after providing the circuit member CM by the process shown in FIG. 8K.

Figure 9A:
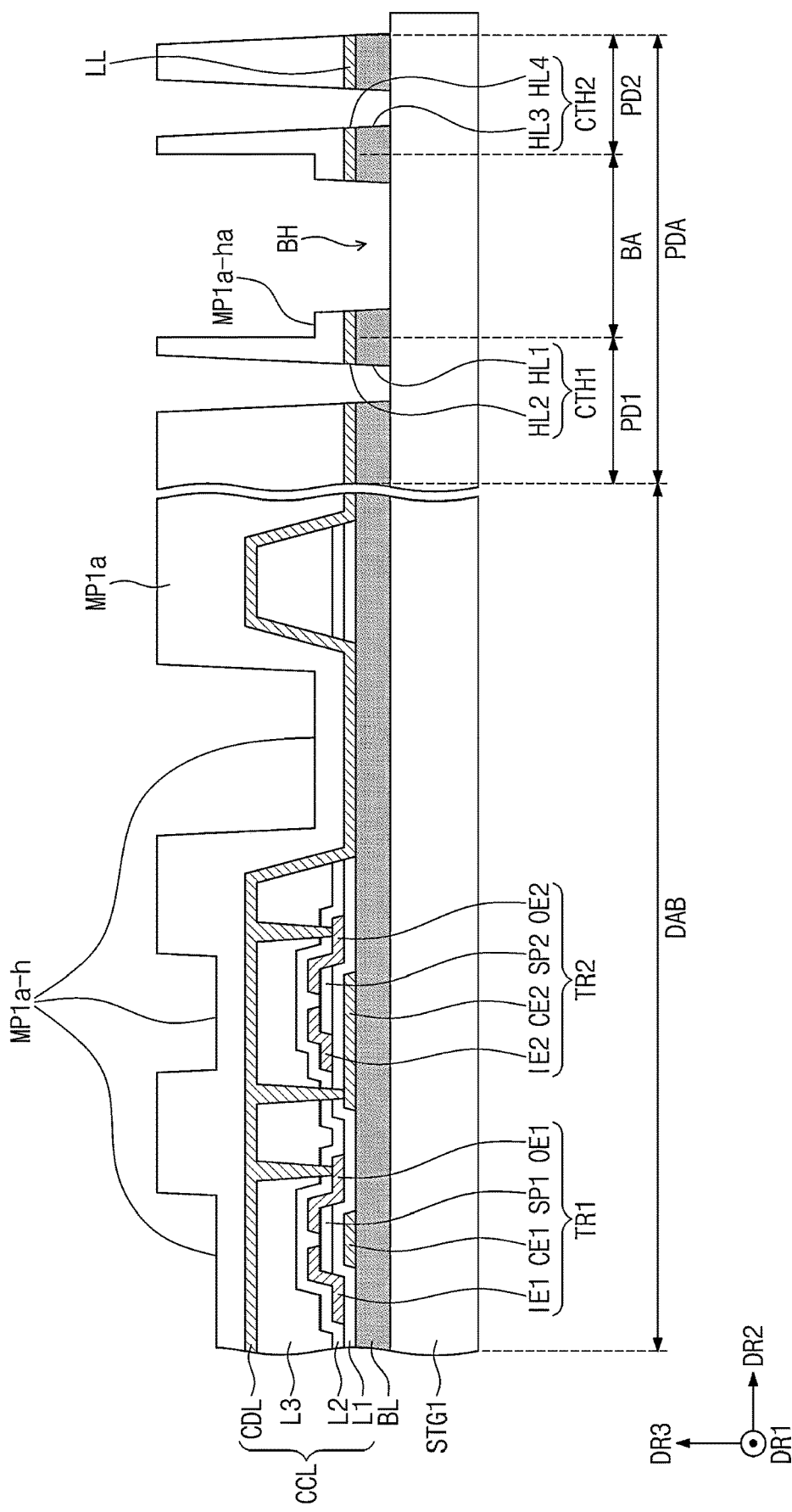
FIGS. 9A to 9C are cross-sectional views showing a part of a manufacturing process of a display module according to an alternative embodiment of the invention.
Figure 9B:
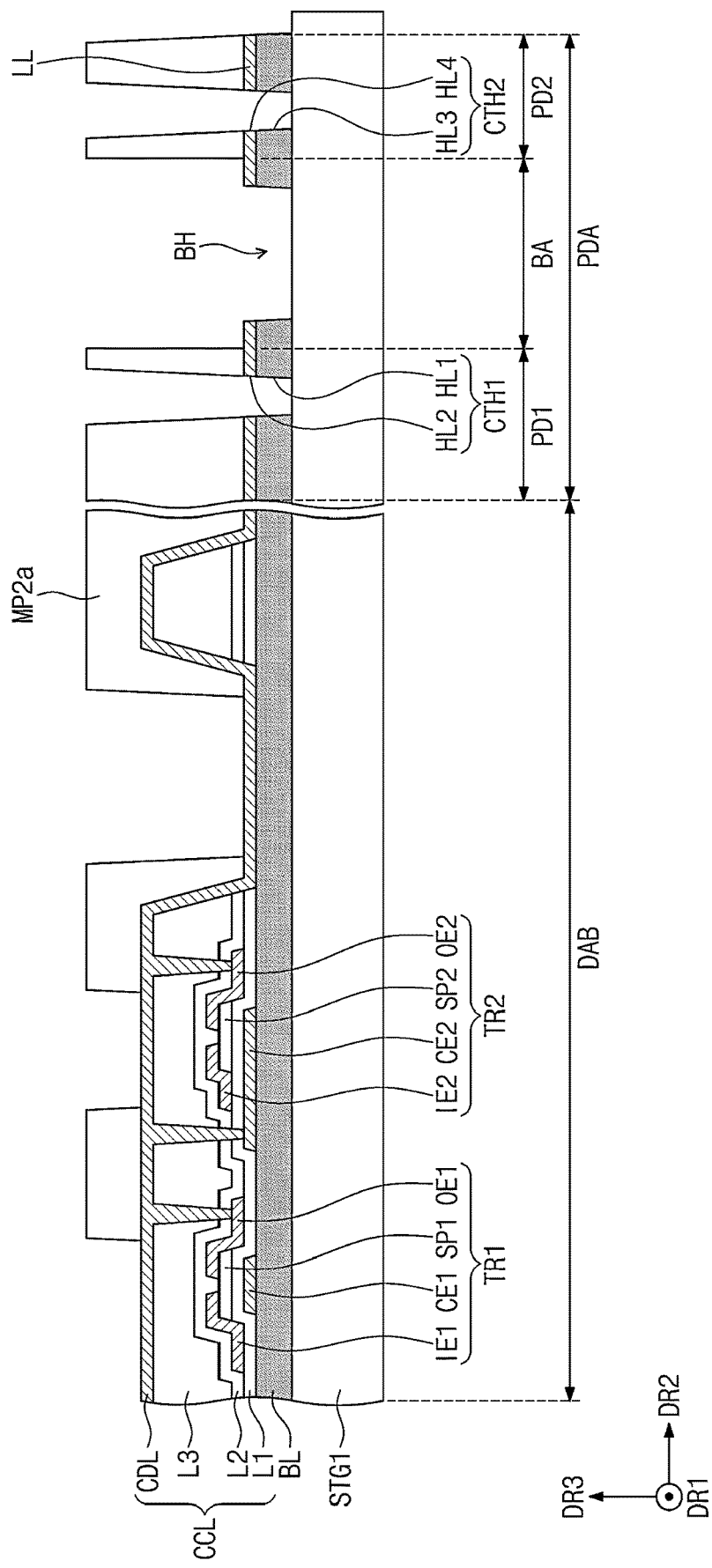
Figure 9C:
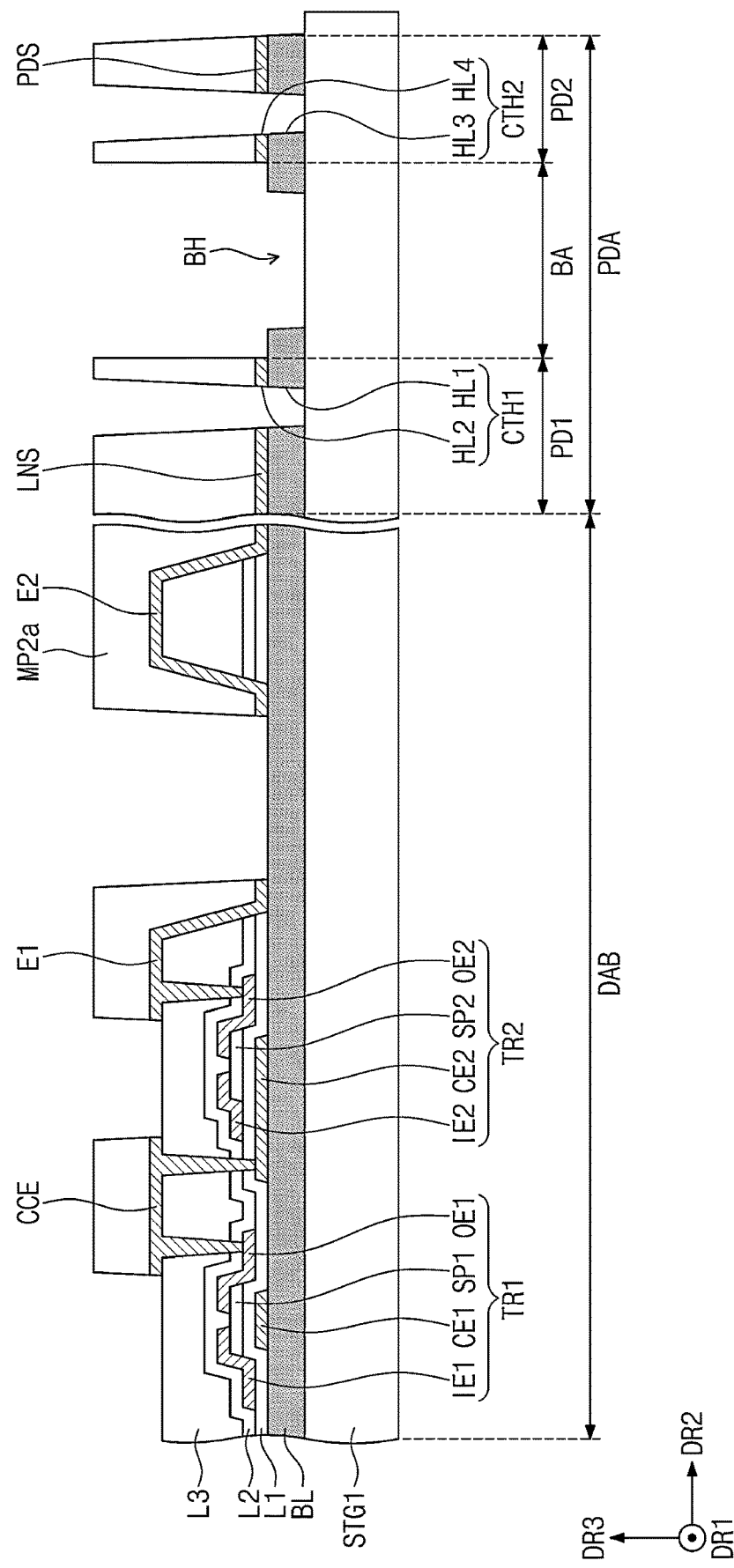

FIGS. 9A to 9C are cross-sectional views showing a part of a manufacturing process of a display module according to an alternative embodiment of the invention.

Referring to FIGS. 8A and 9A, in an embodiment, a first mask pattern MP1a is formed by patterning a first mask layer MPL. In such an embodiment, at least a part of the first mask layer MPL disposed on the pad area PDA and at least a part of the first mask layer MPL disposed in the display area DAB are removed to form the first mask pattern MP1a.

The first mask pattern MP1a may be formed by, for example, using a halftone mask. Therefore, a part of the thickness direction of the first mask layer MPL in the display area DAB and the pad area PDA may be removed. Therefore, the conductive layer CDL of the display area DAB may not be exposed. The remaining portions MP1a-h and MP1a-ha after a portion of the thickness direction is removed from the first mask layer MPL is shown in FIG. 9A. In such an embodiment, the portion where the first mask layer MPL is completely removed in the thickness direction may correspond to the portion where the first mask pattern MP1 shown in FIG. 8D is not disposed, and the remaining part MP1a-ha after a part of the first mask layer MPL is removed from the pad area PDA may correspond to a part where the second mask pattern MP2 shown in FIG. 8F is not disposed.

By using the first mask pattern MP1a, a first contact hole CTH1 may be formed in the first pad area PD1, a second contact hole CTH2 may be formed in the second pad area PD2, and a bending hole BH may be formed in the bending area BA.

Referring to FIG. 9B, the first mask pattern MP1a (see FIG. 9A) is ashed to form a second mask pattern MP2a. The second mask pattern MP2a in the pad area PDA may correspond to the second mask pattern MP2 shown in FIG. 8F.

Referring to FIG. 9C, a wiring layer LL (see FIG. 9B) and a conductive layer (CDL; see FIG. 9B) are patterned using a second mask pattern MP2a. The connection electrode CCE, the first electrode E1, and the second electrode E2 may be formed by patterning the conductive layer CDL, and the wiring layer LL may be patterned to form wiring lines LNS and pads PDS. The wiring layer LL may include wiring lines LNS and pads PDS.

Since the subsequent processes are substantially the same as those described above with reference to FIGS. 8G to 8K, any repetitive detailed description thereof will be omitted.

Figure 10A:
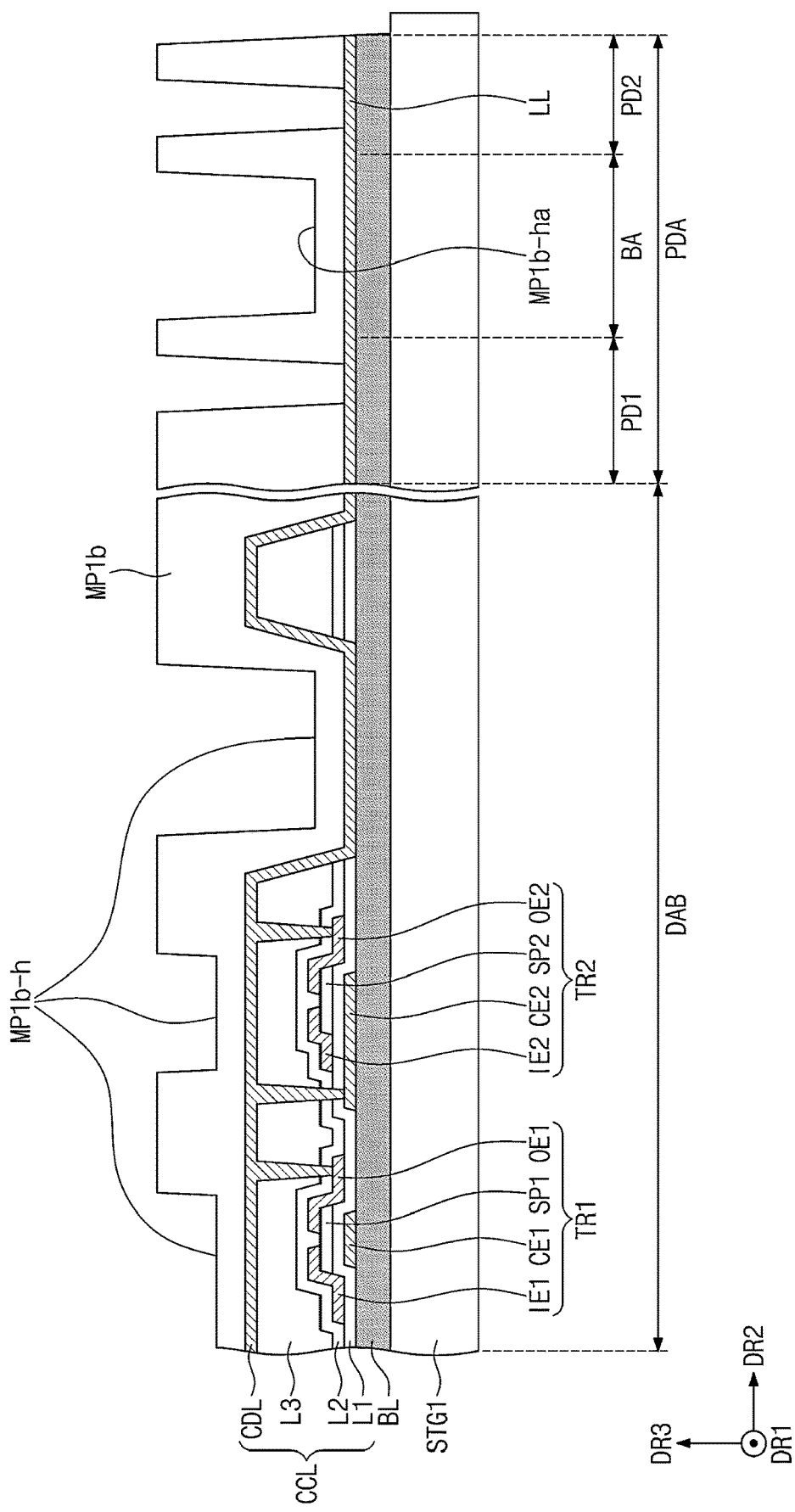
FIGS. 10A to 10C are cross-sectional views showing a part of a manufacturing process of a display module according to another alternative embodiment of the invention.
Figure 10B:
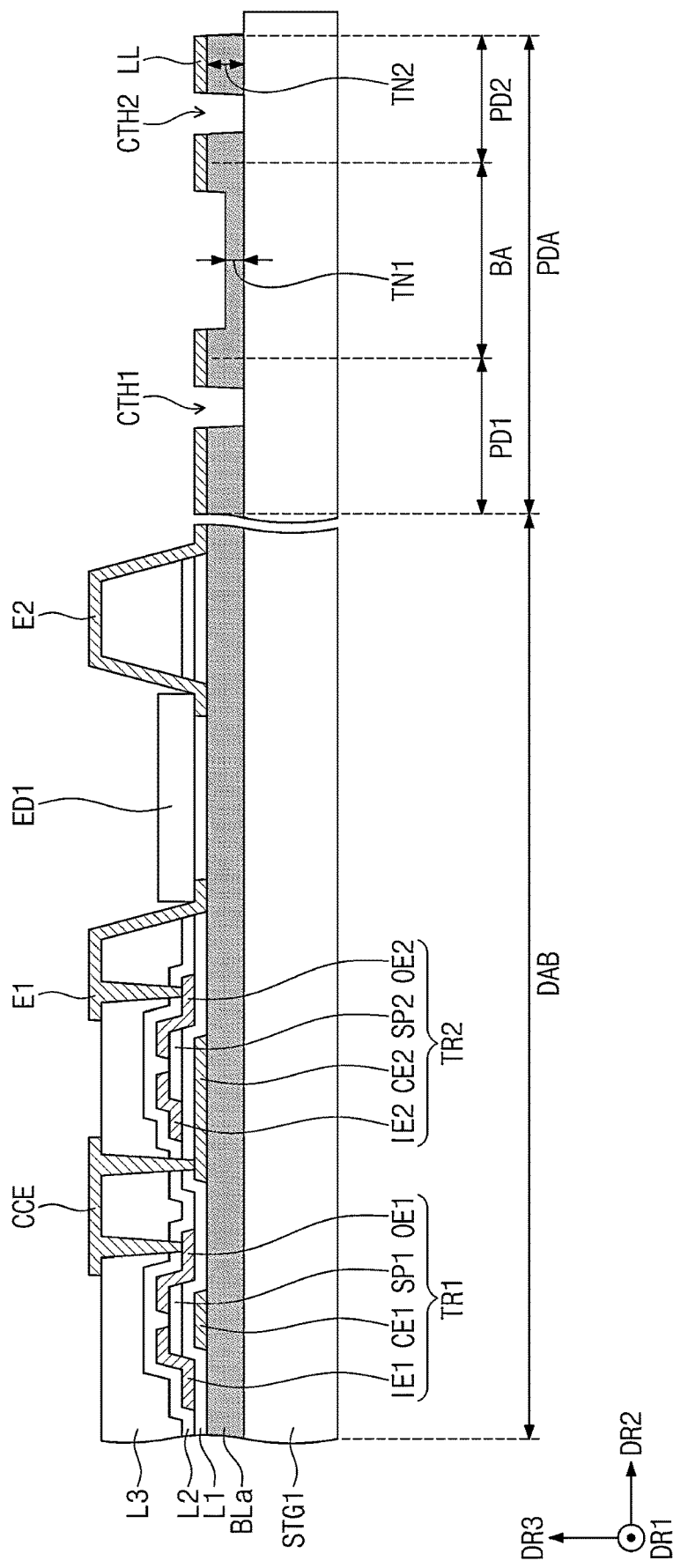
Figure 10C:
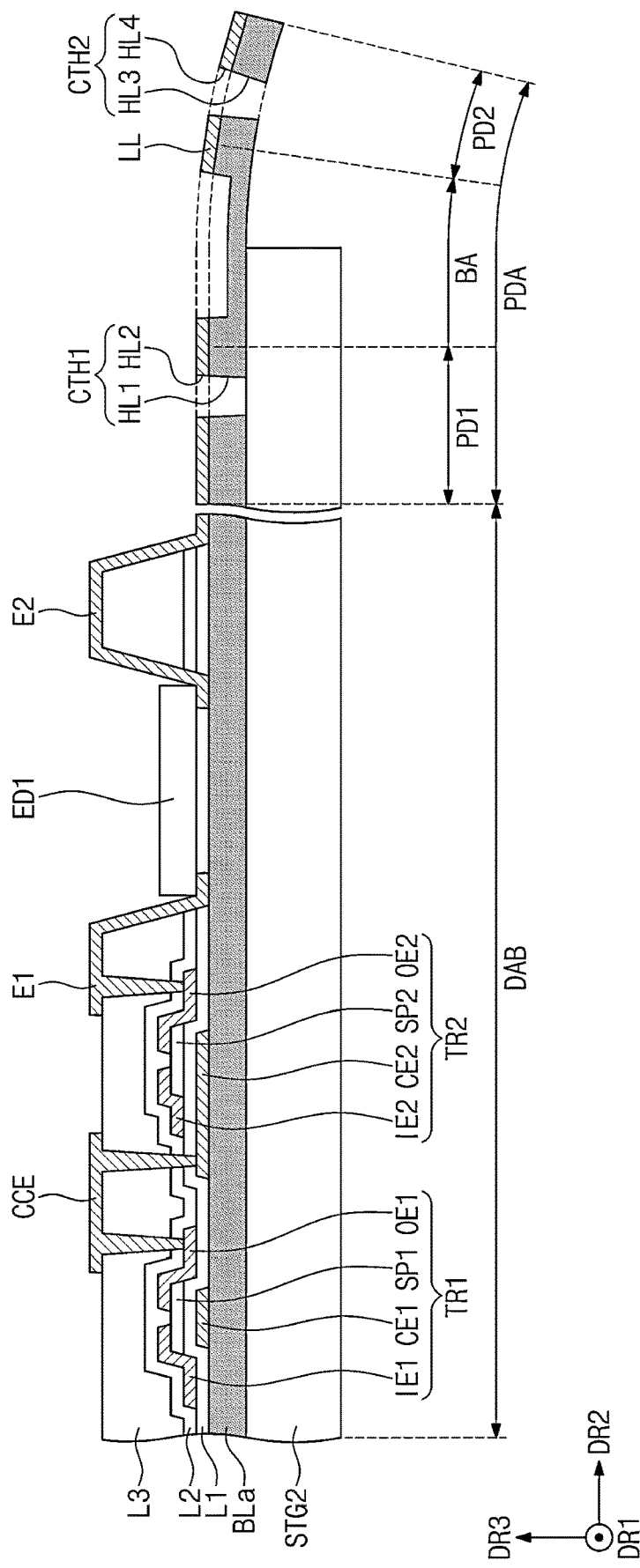

FIGS. 10A to 10C are cross-sectional views showing a part of a manufacturing process of a display module according to another alternative embodiment of the invention.

Referring to FIGS. 8A and 10A, in an embodiment, a first mask pattern MP1b is formed by patterning a first mask layer MPL. In such an embodiment, at least a part of the first mask layer MPL disposed on the pad area PDA and at least a part of the first mask layer MPL disposed in the display area DAB are removed to form the first mask pattern MP1a.

The first mask pattern MP1b may be formed by, for example, using a halftone mask. A part of the thickness direction of the first mask layer MPL in the display area DAB and the pad area PDA may be removed. Therefore, the conductive layer CDL of the display area DAB and the wiring layer LL of the bending area BA may not be exposed. The remaining portions MP1b-h and MP1b-ha after a portion of the thickness direction is removed from the first mask layer MPL is shown in FIG. 10A.

Referring to FIGS. 10A and 10B, a first contact hole CTH1 is formed in a first pad area PD1 and a second contact hole CTH2 is formed in a second pad area PD2 by using a first mask pattern MP1b. Thereafter, the first mask pattern MP1b is ashed, and the wiring layer LL and the conductive layer CDL are patterned using the ashed mask pattern. The connection electrode CCE, the first electrode E1, and the second electrode E2 may be formed by patterning the conductive layer CDL. In such an embodiment, a part of the wiring layer LL of the bending area BA and the base layer BLa of the bending area BA may also be removed. The first thickness TN1 in the bending area BA of the base layer BLa may be less than the second thickness TN2 of the base layer BLa of each of the first pad area PD1 and the second pad area PD2.

Referring to FIG. 10C, the base layer BLa is moved to the bending jig STG2. The bending area BA may be bent in a way such that the first contact hole CTH1 and the second contact hole CTH2 overlap.

According to an embodiment of the invention, since the first thickness TN1 (see FIG. 10B) in the bending area BA is less than the second thickness TN2 (see FIG. 10B) of the base layer BLa of each of the first pad area PD1 and the second pad area PD2, bending of the bending area BA may become easier.

Figure 11A:
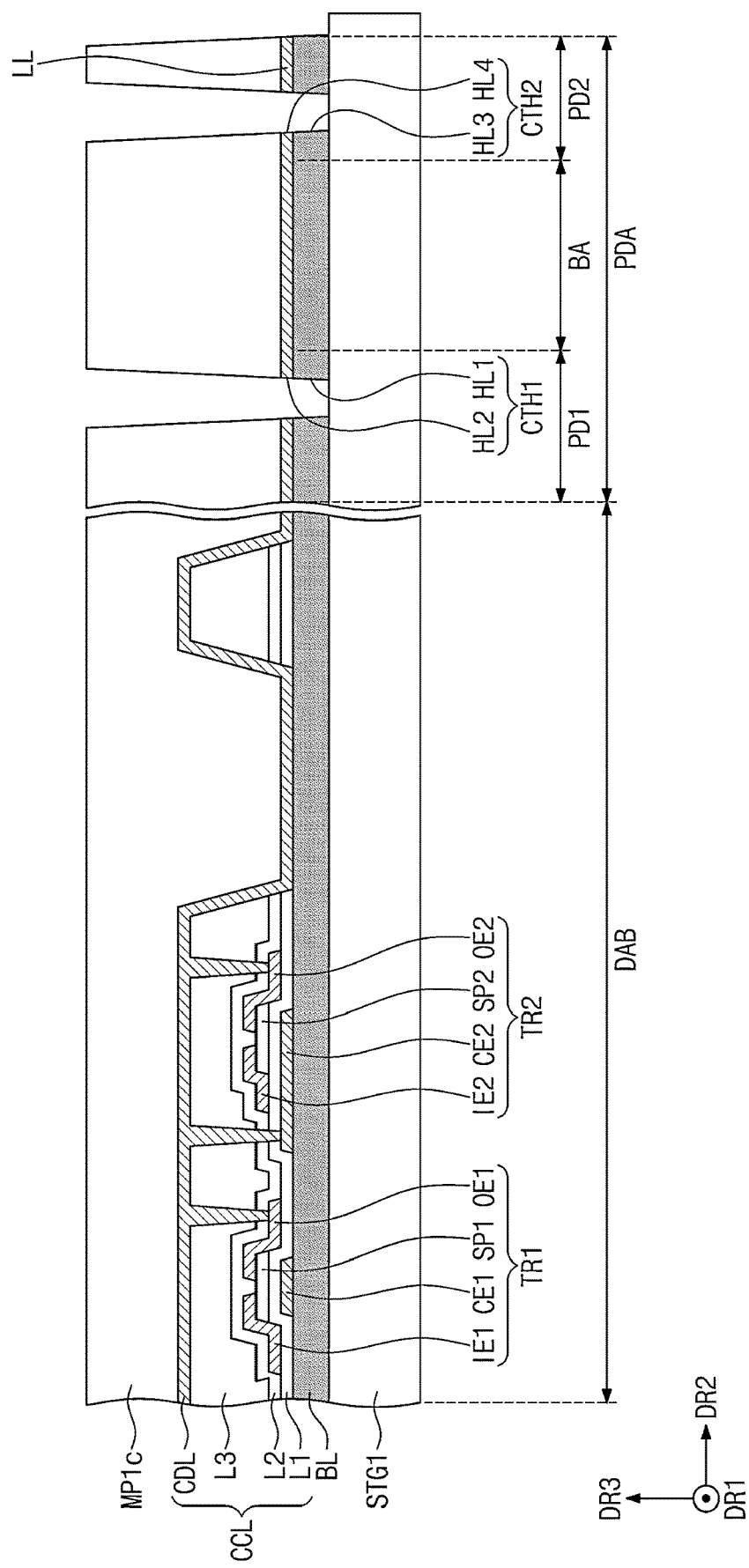
FIGS. 11A to 11C are cross-sectional views showing a part of a manufacturing process of a display module according to another alternative embodiment of the invention.
Figure 11B:
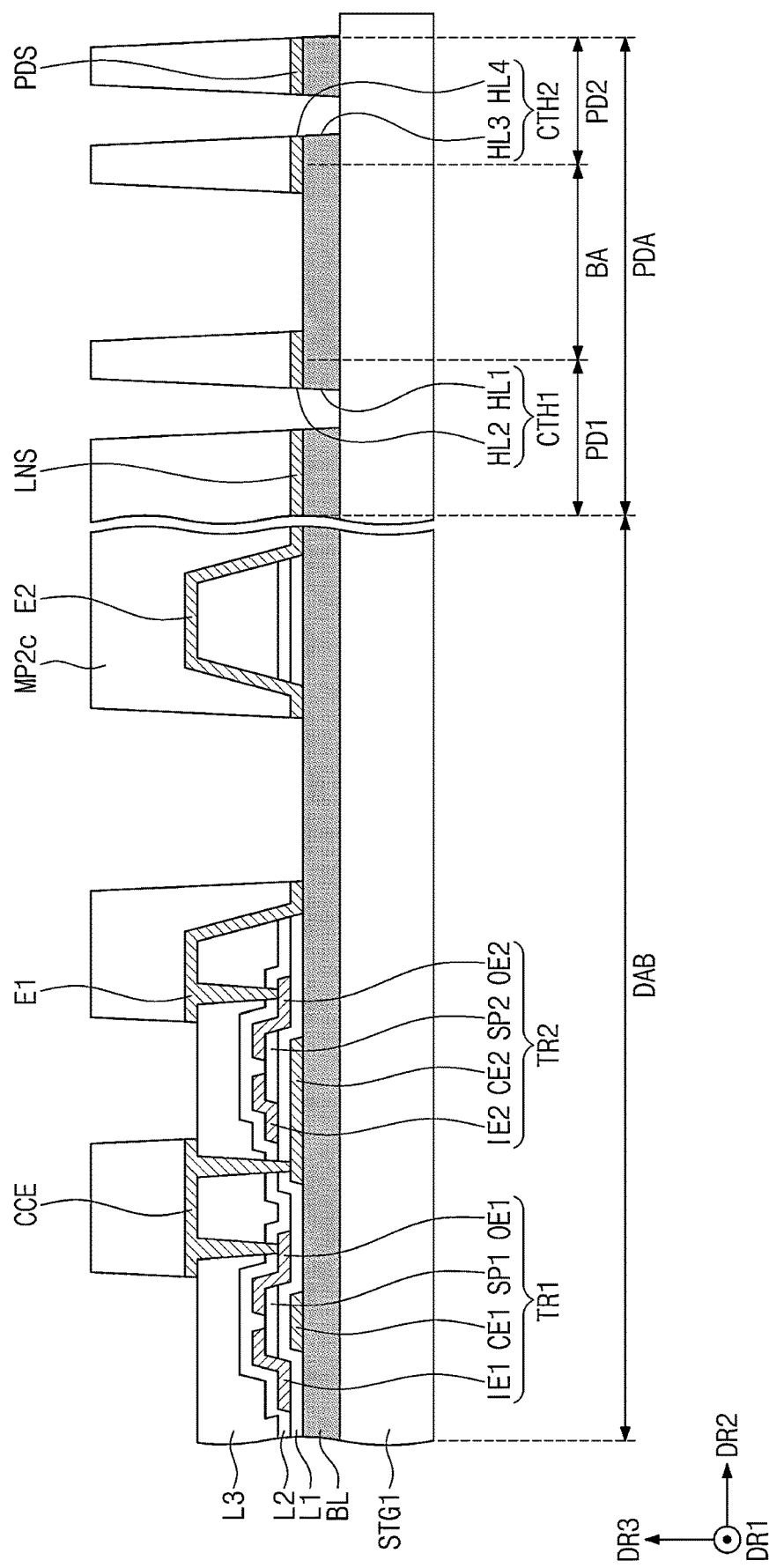
Figure 11C:
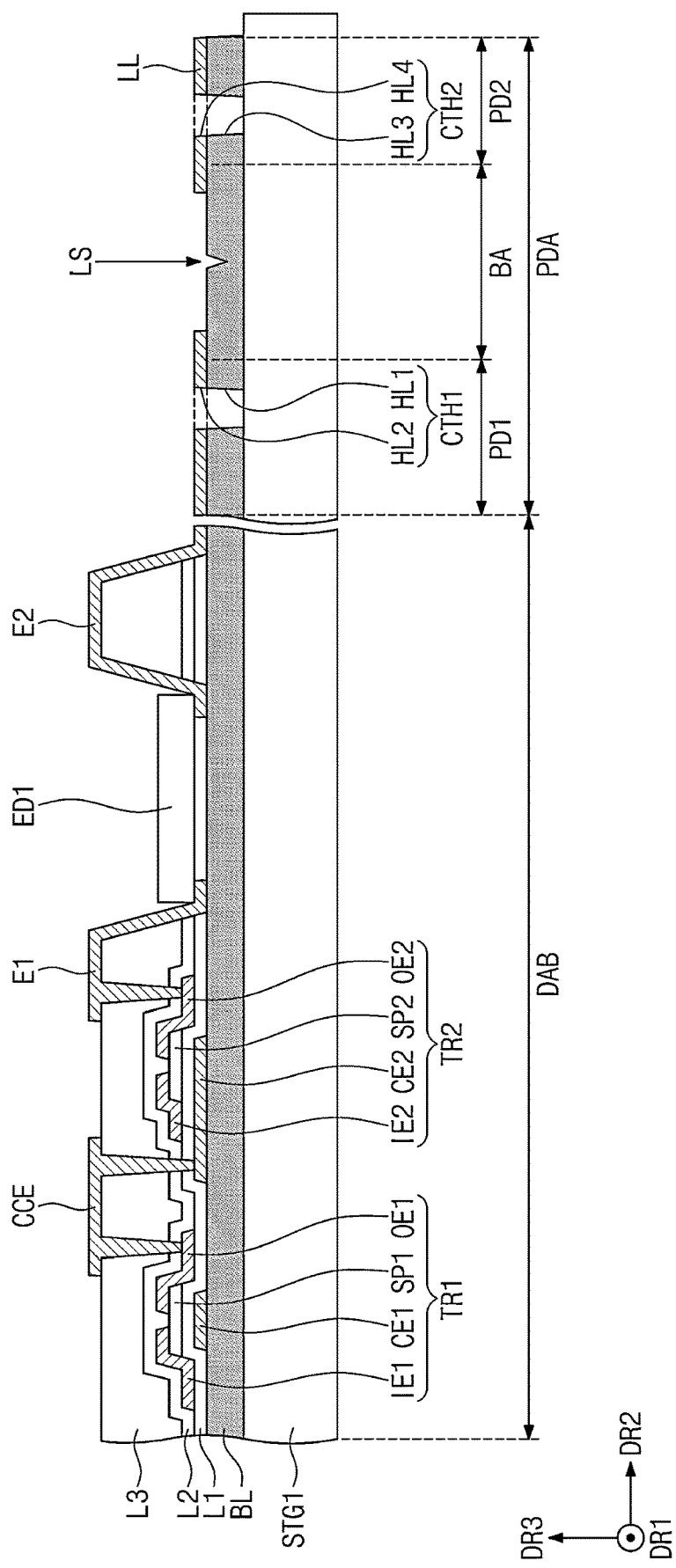

FIGS. 11A to 11C are cross-sectional views showing a part of a manufacturing process of a display module according to another alternative embodiment of the invention.

Referring to FIGS. 8A and 11A, in an embodiment, a first mask pattern MP1c is formed by patterning a first mask layer MPL. In such an embodiment, at least a portion of the first mask layer MPL disposed on the pad area PDA may be removed to form the first mask pattern MP1c, and at least a portion of the first mask layer MPL disposed over the first pad area PD1 and the second pad area PD2 may be removed.

A first contact hole CTH1 is formed in a first pad area PD1 and a second contact hole CTH2 is formed in a second pad area PD2 by using a first mask pattern MP1c. After the first contact holes CTH1 and the second contact holes CTH2 are formed, the first mask pattern MP1c is removed.

Then, a second mask layer (not shown) is provided or formed on the circuit layer CCL. The second mask layer may be provided in a substantially same form as the first mask layer MPL shown in FIG. 8A.

Referring to FIG. 11B, the second mask layer is patterned to form a second mask pattern MP2c. In one embodiment, for example, at least a portion of the second mask layer disposed over the display area DAB and the pad area PDA may be removed to form the second mask pattern MP2c. The second mask pattern MP2c may be a photoresist pattern.

The wiring layer LL and the conductive layer CDL are patterned using the second mask pattern MP2c. The connection electrode CCE, the first electrode E1, and the second electrode E2 may be formed by patterning the conductive layer CDL. In such an embodiment, the wiring layer LL may be patterned by the second mask pattern MP2c.

Referring to FIG. 11C, after removing the second mask pattern MP2c (see FIG. 11B), the bending area BA of the base layer BL is half-cut. In one embodiment, for example, the base layer BL may be half-cut by a laser LS or may be half-cut by a knife. The half-cutting means not cutting the entire thickness of the base layer BL but cutting a part of the thickness of the base layer BL.

In such an embodiment, as the base layer BL of the bending area BA is half-cut, the bending of the base layer BL may become easier.

Figure 12:
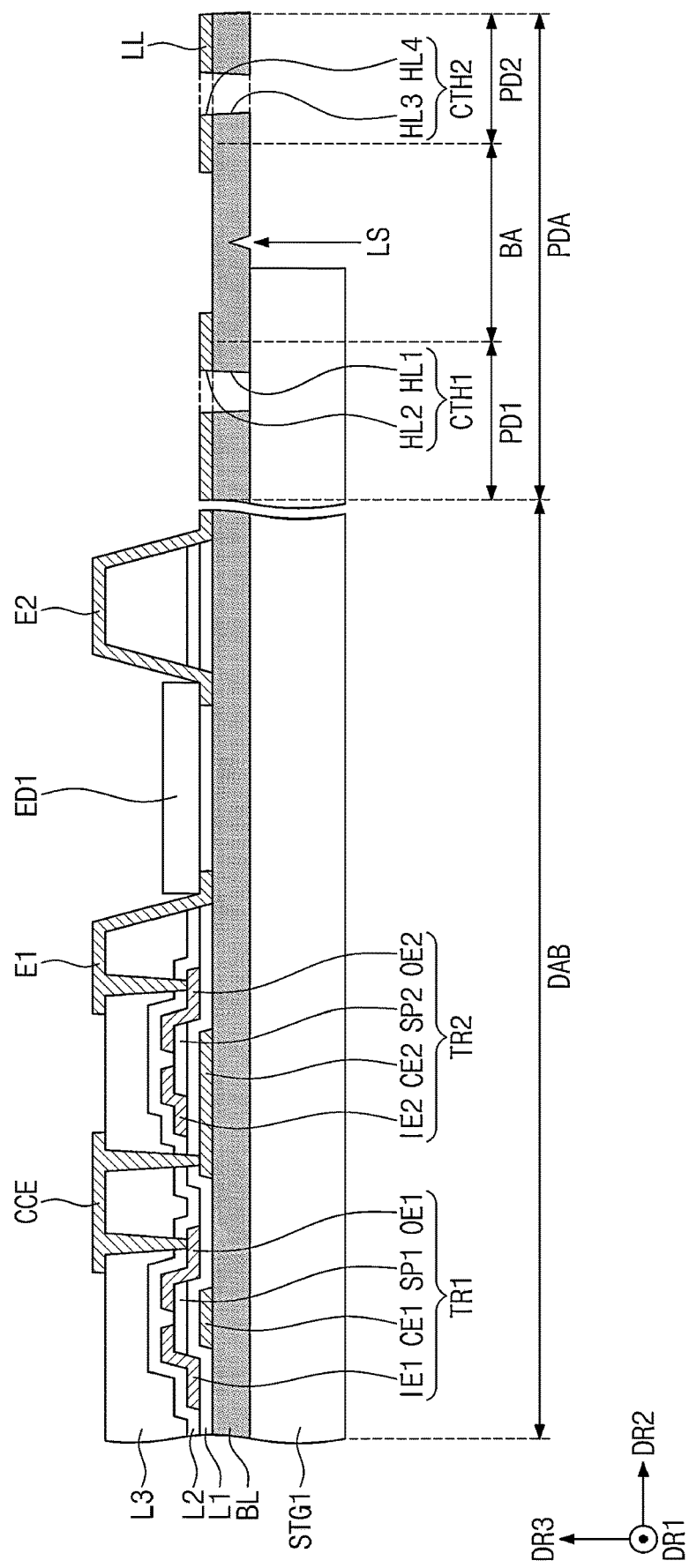
FIG. 12 is a cross-sectional view showing a part of a manufacturing process of a display module according to another alternative embodiment of the invention.

FIG. 12 is a cross-sectional view showing a part of a manufacturing process of a display module according to another alternative embodiment of the invention.

In an embodiment, as shown in FIG. 11C, the upper surface of the base layer BL may be half-cut, but in an alternative embodiment, as shown in FIG. 12, the lower surface of the base layer BL may be half-cut.

FIGS. 13A to 13D are cross-sectional views showing a part of a manufacturing process of a display module according to an embodiment of the invention. FIG. 13E is a plan view of a base layer according to an embodiment of the invention. FIG. 13F is a cross-sectional view taken along line II-IF shown in FIG. 13E.

Figure 13A:
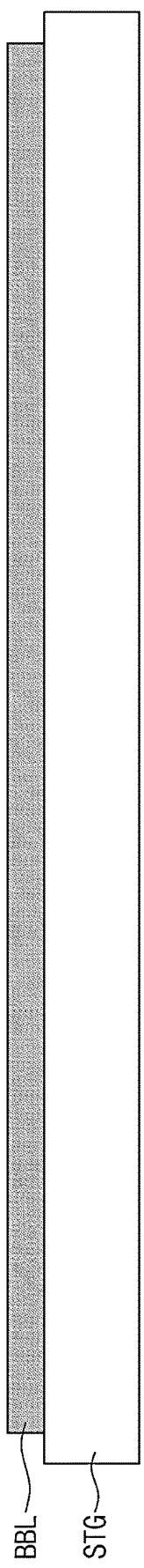
FIGS. 13A to 13D are cross-sectional views showing a part of a manufacturing process of a display module according to an embodiment of the invention.

Referring to FIG. 13A, a preliminary base layer BBL is provided or formed on a carrier substrate STG. The preliminary base layer BBL may include a material for securing flexibility. In one embodiment, For example, the preliminary base layer BBL may include a same material as the base layer BL (see FIG. 3) described above with reference to FIG. 3.

Figure 13B:
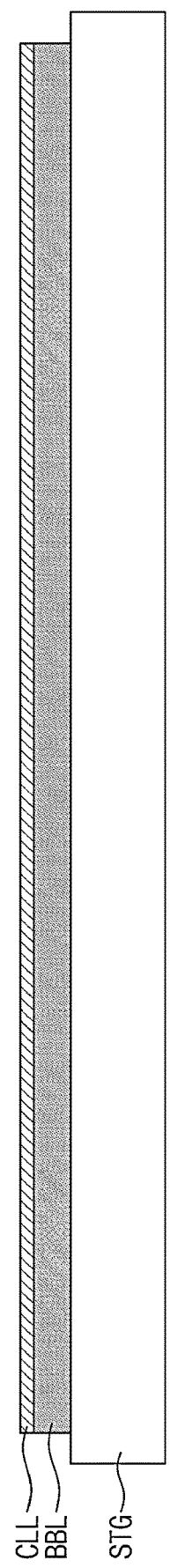

Referring to FIG. 13B, a circuit layer CLL is provided or formed on the preliminary base layer BBL. The circuit layer CLL may include a plurality of conductive layers, a plurality of insulating layers, and a semiconductor layer.

Figure 13C:
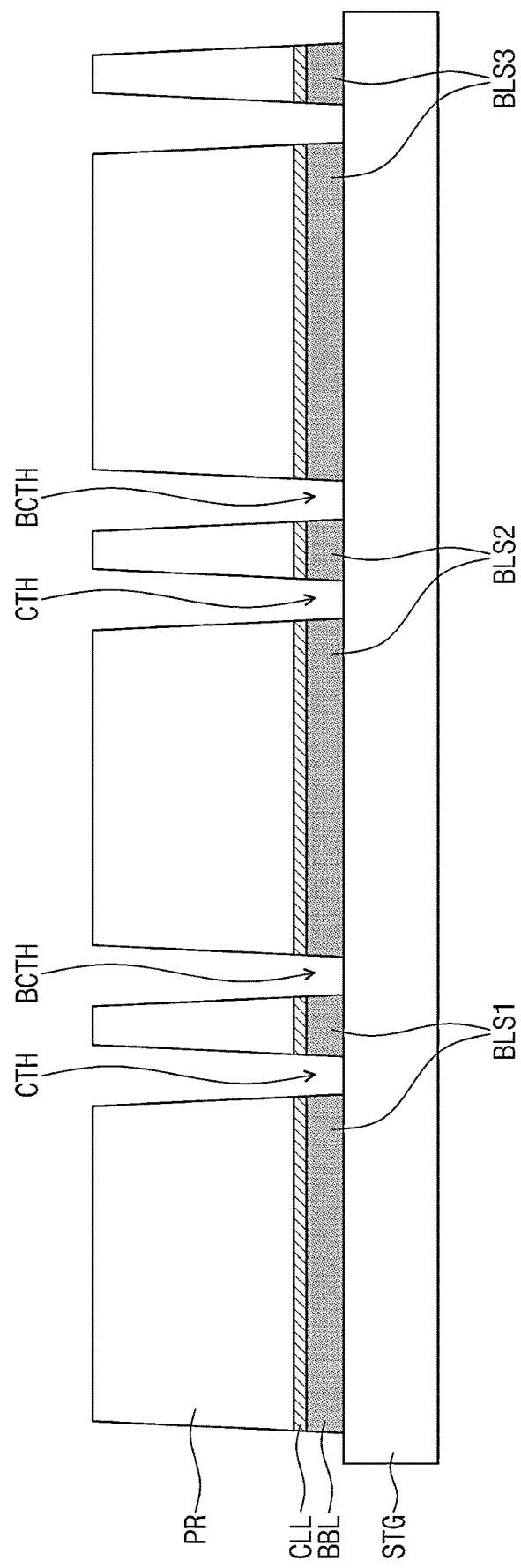

Referring to FIG. 13C, a though hole CTH and a boundary hole BCTH are formed in the preliminary base layer BBL and the circuit layer CCL. The though hole CTH and the boundary hole BCTH may be formed at the same time, e.g., simultaneously during a same process.

The though hole CTH may include the first hole HL1 and the second hole HL2 described with reference to FIG. 4. At least a part of the preliminary base layer BBL may be removed to form the boundary hole BCTH and the base layers BLS1, BLS2 and BLS3 may be separated by the boundary hole BCTH. Further, as the boundary hole BCTH is formed, the connection portions CBL (see FIG. 13D) may be formed.

Figure 13D:
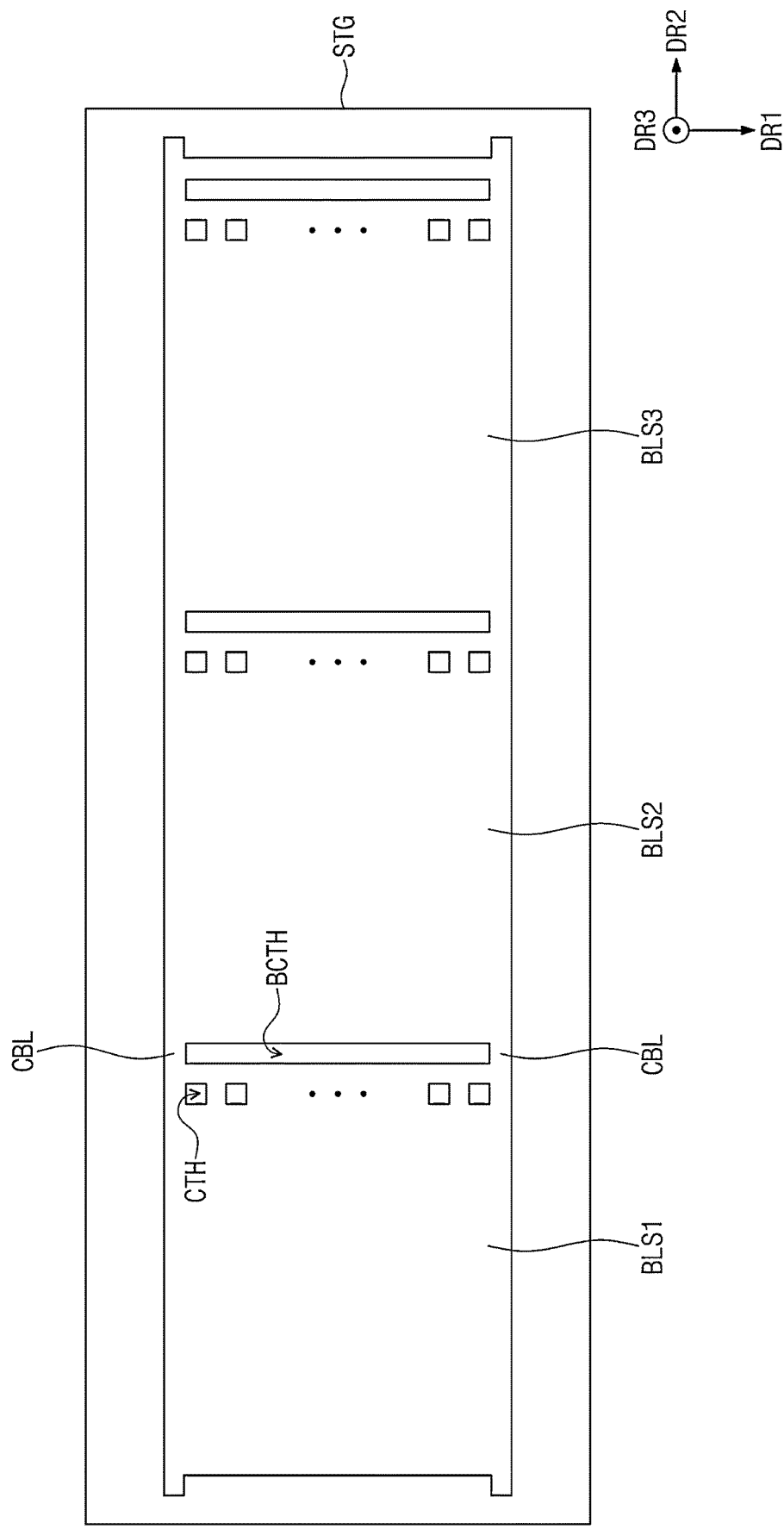
Figure 13E:
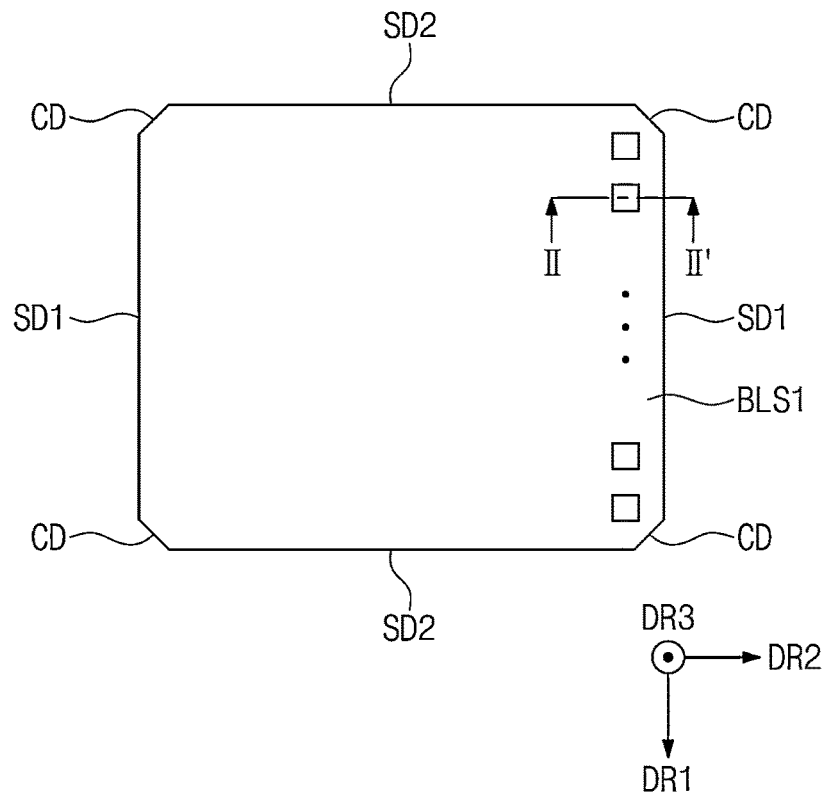
FIG. 13E is a plan view of a base layer according to an embodiment of the invention.
Figure 13F:
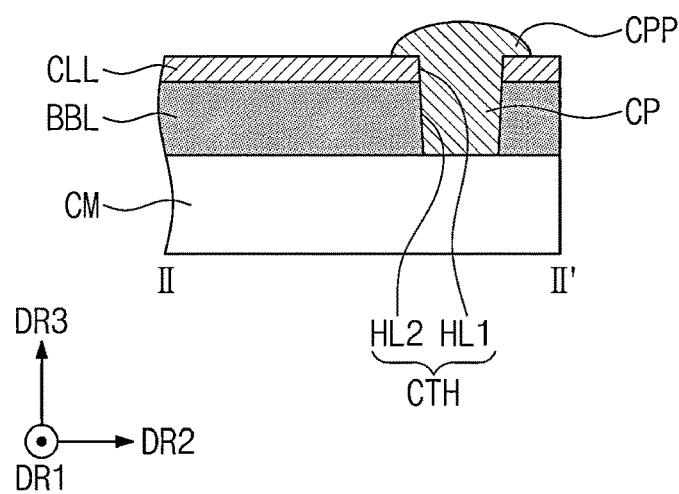
FIG. 13F is a cross-sectional view taken along line II-IF shown in FIG. 13E.

Referring to FIG. 13D, two base layers BLS1 and BLS2 may be spaced apart from each other with the boundary hole BCTH therebetween. Each of the base layers BLS1, BLS2, and BLS3 may constitute one display module.

The boundary hole BCTH may be defined on a plane between two base layers BLS1 and BLS2 and two connection portions CBL. In FIG. 13C, an embodiment having a structure in which a boundary hole BCTH is formed between two base layers BLS1 and BLS2 and two connection portions CBL are disposed is shown, but the invention is not limited thereto. In one alternative embodiment of the invention, for example, the boundary hole BCTH may be provided in plurality, and a connection portion may be additionally disposed between the plurality of boundary holes.

According to an embodiment of the invention, the area for handling during the display module fabrication process may also be reduced as the width of a non-display area is reduced. Connection portions CBL may be provided to secure an area for the handling.

Referring to FIG. 13E, the connection portions CBL (see FIG. 13D) may be removed in a later process. In one embodiment, for example, the connection portions CBL may be removed by a chamfering process. The connection portions CBL may be removed by a laser or removed by a knife.

Therefore, in such an embodiment, the base layer BLS1 may include first sides SD1 extending in the first direction DR1 and second sides SD2 extending in the second direction DR2, and a connection side CD for connecting one of the first sides SD1 and one of the second sides SD2. In an embodiment, where the connection portions CBL are provided in a portion adjacent to four vertices, the number of connection sides CD may be four. In an alternative embodiment of the invention, where the connection portions CBL are provided in a portion adjacent to two vertices, there may be two connection sides CD.

FIG. 13E shows an embodiment where the connection side CD has a straight line shape, but the invention is not limited thereto. In one alternative embodiment, for example, the connection side CD may have a curved shape on a plane.

FIG. 13F is a cross-sectional view taken along line II-IF shown in FIG. 13E. A circuit member CM may be disposed directly below the base layer BL, and the circuit member CM may be electrically connected to the circuit layer CLL through a conductive part CP disposed in the though hole CTH. Thus, the width of the non-display area may be reduced.

According to embodiments of the invention, a hole is defined in the base layer of the display panel, and a wiring layer disposed on one side of the base layer and a circuit member disposed on the other side of the base layer may be electrically connected by a conductive part disposed in the hole. Therefore, the width of the non-display area of the display panel may be reduced.

In such embodiments, a portion of the conductive part may cover a portion of the wiring layer. As the contact area of the conductive part and the wiring layer increases, the contact resistance may be reduced, and also, as the contact area increases, the contact between the wiring layer and the conductive part may be more stable.

Although some exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display module comprising:
a base layer where a first hole is defined;
a wiring layer disposed on the base layer, wherein a second hole is defined in the wiring layer on an area corresponding to the first hole in a thickness direction of the display module;
an image display element layer electrically connected to the wiring layer;
a circuit member disposed below the base layer; and
a conductive part disposed in the first hole and the second hole to electrically connect the wiring layer and the circuit member,
wherein the conductive part comprises a protruding protein further protruding from an upper surface of the writing layer,
wherein the protruding portion overlaps the first hole and the second hole, and
wherein at least a portion of an upper surface of the wiring layer is covered by a portion of the protruding portion.

2. The display module of claim 1, further comprising:
a sub-base layer disposed below the base layer, wherein a third hole defined in the sub-base layer on an area corresponding to the second hole when viewed in the thickness direction of the display module; and
a sub-wiring layer disposed below the sub-base layer, wherein a fourth hole defined in the sub-wiring layer on an area corresponding to the third hole in the thickness direction of the display module,
wherein
the sub-wiring layer is electrically connected to the circuit member, and
the conductive part is disposed in the first hole, the second hole, the third hole and the fourth hole to electrically connect the wiring layer to the circuit member.

3. The display module of claim 2, wherein
the sub-base layer and the circuit member are disposed on a back surface of the base layer,
the display module further comprising a connection conductive part connecting the sub-base layer and the circuit member.

4. The display module of claim 2, wherein
the base layer comprises a first alignment pattern, and
the sub-base layer comprises a second alignment pattern,
wherein the first alignment pattern is aligned with the second alignment pattern in the thickness direction of the display module.

5. The display module of claim 1, wherein
the base layer comprises a first alignment pattern, and
the circuit member comprises a second alignment pattern,
wherein the first alignment pattern is aligned with the second alignment pattern in the thickness direction of the display module.

6. The display module of claim 1, wherein when viewed in the thickness direction of the display module, the base layer comprises:
first sides extending in a first direction and spaced apart from each other;
second sides extending in a second direction intersecting the first direction and spaced apart from each other; and
a connection side connecting one of the first sides to one of the second sides.

7. A display device comprising at least one display module,
wherein the display module comprises:
a base layer where a first hole is defined;
a wiring layer disposed on the base layer, wherein a second hole is defined in the wiring layer on an area corresponding to the first hole when viewed in a thickness direction of the display module;
a sub-base layer disposed below the base layer, wherein a third hole is defined in the sub-base layer on an area corresponding to the second hole in the thickness direction of the display module;
a sub-wiring layer disposed below the sub-base layer, wherein a fourth hole is defined in the sub-wiring layer on an area corresponding to the third hole in the thickness direction of the display module;
a circuit member disposed below the base layer; and
a conductive part disposed in the first hole, the second hole, the third hole, and the fourth hole to electrically connect the wiring layer and the circuit member,
wherein the sub-base layer includes a same material as the base layer and has an area smaller than an area of the base layer.

* * * * *